United States Patent
Li et al.

(10) Patent No.: US 11,472,732 B2
(45) Date of Patent: Oct. 18, 2022

(54) GLASS-BASED ARTICLES WITH IMPROVED STRESS PROFILES

(71) Applicant: CORNING INCORPORATED, Corning, NY (US)

(72) Inventors: Qiao Li, Horseheads, NY (US); Pascale Oram, Hammondsport, NY (US); Rostislav Vatchev Roussev, Painted Post, NY (US)

(73) Assignee: CORNING INCORPORATED, Corning, NY (US)

( * ) Notice: Subject to any disclaimer, the term of this patent is extended or adjusted under 35 U.S.C. 154(b) by 294 days.

(21) Appl. No.: 16/585,149

(22) Filed: Sep. 27, 2019

(65) Prior Publication Data

US 2020/0102243 A1    Apr. 2, 2020

Related U.S. Application Data

(60) Provisional application No. 62/738,404, filed on Sep. 28, 2018.

(51) Int. Cl.
  C03C 21/00    (2006.01)
  H05K 5/00    (2006.01)
  H05K 5/03    (2006.01)

(52) U.S. Cl.
  CPC ......... C03C 21/002 (2013.01); H05K 5/0017 (2013.01); H05K 5/03 (2013.01)

(58) Field of Classification Search
  None
  See application file for complete search history.

(56) References Cited

U.S. PATENT DOCUMENTS

| | | | |
|---|---|---|---|
| 3,433,611 A * | 3/1969 | Kubichan | C03C 3/097 65/30.14 |
| 8,312,739 B2 | 11/2012 | Lee et al. | |
| 8,561,429 B2 | 10/2013 | Allan et al. | |
| 8,854,623 B2 | 10/2014 | Fontaine et al. | |
| 9,884,784 B2 | 2/2018 | Kashima et al. | |
| 2015/0239775 A1* | 8/2015 | Amin | C03C 3/091 428/220 |
| 2016/0376186 A1 | 12/2016 | Gross | |
| 2017/0022092 A1* | 1/2017 | DeMartino | G06F 1/1656 |
| 2017/0197384 A1* | 7/2017 | Finkeldey | B60J 1/2094 |
| 2017/0295657 A1* | 10/2017 | Gross | C03C 3/097 |
| 2017/0305786 A1* | 10/2017 | Roussev | H05K 5/0217 |
| 2017/0369354 A1 | 12/2017 | Endo et al. | |
| 2018/0071881 A1 | 3/2018 | Horie et al. | |

(Continued)

FOREIGN PATENT DOCUMENTS

| | | | |
|---|---|---|---|
| DE | 112014003338 T5 | 3/2016 | |
| DE | 112016002662 T5 | 3/2018 | |

(Continued)

OTHER PUBLICATIONS

International Search Report and Written Opinion of the European International Searching Authority; PCT/US2019/053364; dated Jan. 2, 2020; 15 Pgs.

*Primary Examiner* — David Sample
(74) *Attorney, Agent, or Firm* — Kevin Johnson

(57) ABSTRACT

Glass-based articles are provided with improved stress profiles. The glass-based articles provide improved drop performance and damage resistance. The glass-based articles may be produced with a single ion exchange treatment.

22 Claims, 6 Drawing Sheets

(56) References Cited

U.S. PATENT DOCUMENTS

| | | |
|---|---|---|
| 2018/0297892 A1* | 10/2018 | Lee .................. C03C 3/083 |
| 2019/0033144 A1 | 1/2019 | Andrews et al. |
| 2019/0161386 A1 | 5/2019 | Gross et al. |
| 2019/0161390 A1 | 5/2019 | Gross et al. |
| 2019/0205597 A1 | 7/2019 | Tomeno |
| 2019/0375679 A1* | 12/2019 | Gross ................ C03C 21/002 |

FOREIGN PATENT DOCUMENTS

| | | | |
|---|---|---|---|
| WO | 2015127483 A2 | 8/2015 | |
| WO | 2016191676 A1 | 12/2016 | |
| WO | WO-2017177109 A1 * | 10/2017 | ............ H05K 5/03 |
| WO | 2018/047710 A1 | 3/2018 | |
| WO | 2018143991 A1 | 8/2018 | |
| WO | WO-2018143991 A1 * | 8/2018 | ........... C03C 21/002 |

* cited by examiner

GLASS-BASED ARTICLES WITH IMPROVED STRESS PROFILES

CROSS-REFERENCE TO RELATED APPLICATIONS

This application claims the benefit of priority of U.S. Provisional Application Ser. No. 62/738,404 filed on Sep. 28, 2018, the content of which is relied upon and incorporated herein by reference in its entirety.

BACKGROUND

Field

The present specification generally relates to stress profiles for fracture resistant stress profiles in glass-based articles. More specifically, the present specification is directed to stress profiles for glass-based articles, which may be lithium-containing, that may be utilized in electronic devices.

Technical Background

The mobile nature of portable devices, such as smart phones, tablets, portable media players, personal computers, and cameras, makes these devices particularly vulnerable to accidental dropping on hard surfaces, such as the ground. These devices typically incorporate cover glasses, which may become damaged upon impact with hard surfaces. In many of these devices, the cover glasses function as display covers, and may incorporate touch functionality, such that use of the devices is negatively impacted when the cover glasses are damaged.

There are two major failure modes of cover glass when the associated portable device is dropped on a hard surface. One of the modes is flexure failure, which is caused by bending of the glass when the device is subjected to dynamic load from impact with the hard surface. The other mode is sharp contact failure, which is caused by introduction of damage to the glass surface. Impact of the glass with rough hard surfaces, such as asphalt, granite, etc., can result in sharp indentations in the glass surface. These indentations become failure sites in the glass surface from which cracks may develop and propagate.

It has been a continuous effort for glass makers and handheld device manufacturers to improve the resistance of handheld devices to failure. It is also desirable that portable devices be as thin as possible. Accordingly, in addition to strength, it is also desired that glasses to be used as cover glass in portable devices be made as thin as possible. Thus, in addition to increasing the strength of the cover glass, it is also desirable for the glass to have mechanical characteristics that allow it to be formed by processes that are capable of making thin glass-based articles, such as thin glass sheets.

Accordingly, a need exists for glasses that can be strengthened, such as by ion exchange, and that have the mechanical properties that allow them to be formed as thin glass-based articles.

SUMMARY

Aspects of the disclosure pertain to glass-based articles and methods for their manufacture and use. Glass-based articles herein exhibit excellent drop performance.

In an embodiment, a glass-based article comprises: a glass-based substrate comprising opposing first and second surfaces defining a substrate thickness (t); and a stress profile comprising: a peak compressive stress (CS) greater than or equal to 700 MPa; a peak tension (PT) less than or equal to 61 MPa; a depth of compression (DOC) that is greater than or equal to 0.1 t; a depth of layer of a spike ($DOL_{sp}$) that is greater than or equal to 4.5 micrometers; and a stress slope of the spike that is greater than or equal to 40 MPa/micrometer.

In an embodiment, a glass-based article comprises: a glass-based substrate comprising opposing first and second surfaces defining a substrate thickness (t); and a central composition at the center of the glass-based article comprising lithium; a potassium (K) concentration profile that is substantially linear from a maximum K concentration to a concentration of K that is less than or equal to 50% of the maximum K concentration; and a stress profile comprising: a depth of layer of the spike ($DOL_{sp}$) that is greater than or equal to 0.005 t.

According to some embodiments, a stress profile for a lithium-containing glass-based article is provided that exhibits excellent drop performance and damage resistance.

In an embodiment, a method of manufacturing a glass-based article comprises: exposing a glass-based substrate to a single molten salt bath to form the glass-based article, wherein the glass-based substrate contains lithium, the glass-based substrate has opposing first and second surfaces defining a substrate thickness (t) and the molten bath comprises: potassium nitrate ($KNO_3$); and potassium carbonate ($K_2CO_3$) that is dissolved in the potassium nitrate ($KNO_3$); wherein the concentration of the $K_2CO_3$ remains at or below its solubility limit, and the concentration of lithium ions in the molten salt bath remains at or below its solubility limit.

According to aspect (1), a glass-based article is provided. The glass-based article comprises: a glass-based substrate comprising opposing first and second surfaces defining a substrate thickness (t); and a stress profile comprising: a peak compressive stress (CS) greater than or equal to 700 MPa; a peak tension (PT) less than or equal to 61 MPa; a compressive stress at a knee ($CS_k$); a depth of compression (DOC) that is greater than or equal to 0.1t; a spike region extending from the first surface to a depth of layer of a spike region ($DOL_{sp}$), where $DOL_{sp}$ is greater than or equal to 4.5 micrometers; and a stress slope of the spike region that is greater than or equal to 40 MPa/micrometer.

According to aspect (2), the glass-based article of aspect (1) is provided, further comprising a potassium (K) concentration profile that is substantially linear from a maximum K concentration to a point where the K concentration is less than or equal to 50% of the maximum K concentration.

According to aspect (3), a glass-based article is provided. The glass-based article comprises: a glass-based substrate comprising opposing first and second surfaces defining a substrate thickness (t); a central composition at the center of the glass-based article comprising lithium; a potassium (K) concentration profile that is substantially linear from a maximum K concentration to a point where the K concentration is less than or equal to 50% of the maximum K concentration; and a stress profile comprising: a peak compressive stress (CS), a peak tension (PT), a compressive stress at a knee ($CS_k$); a depth of compression (DOC); and a spike region extending from the first surface to a depth of layer of a spike region ($DOL_{sp}$), where $DOL_{sp}$ is greater than or equal to 0.005t.

According to aspect (4), the glass-based article of aspect (3) is provided, wherein the CS is greater than or equal to 700 MPa.

According to aspect (5), the glass-based article of any of aspects (3) to (4) is provided, wherein the PT is less than or equal to 61 MPa.

According to aspect (6), the glass-based article of any of aspects (3) to (5) is provided, wherein the DOC is greater than or equal to 0.1 t.

According to aspect (7), the glass-based article of any of aspects (3) to (6) is provided, wherein a stress slope of the spike region is greater than or equal to 40 MPa/micrometer.

According to aspect (8), the glass-based article of any of aspects (1) to (7) is provided, wherein t is greater than or equal to 0.35 mm and less than or equal to 1 mm.

According to aspect (9), the glass-based article of any of aspects (1) to (8) is provided, wherein a lithium oxide ($Li_2O$) to sodium oxide ($Na_2O$) molar ratio ($Li_2O/Na_2O$) at the center of the glass-based article is in the range of from 0.3 to 1.1.

According to aspect (10), the glass-based article of any of aspects (2) to (9) is provided, wherein the potassium (K) concentration profile is substantially linear from a maximum K concentration to a point where the K concentration is less than or equal to 20% of the maximum K concentration.

According to aspect (11), the glass-based article of aspect (10) is provided, wherein a second derivative of the K concentration profile over a first derivative of the K concentration profile is less than or equal to a value over a region extending from the first surface to a depth where a K concentration is equal to the sum of: a) the K concentration at the center of the glass-based article, and b) 20% of the difference between the peak K concentration and the K concentration at the center of the glass-based article, wherein the value is 0.5, 0.4, or 0.3 of what is typical for an erfc function at the location where the erfc function decreases to 20% of its peak value.

According to aspect (12), the glass-based article of any of aspects (1) to (11) is provided, wherein the potassium (K) concentration profile is substantially linear from the location of $CS_{max}$ to a point having a stress of less than or equal to 50% of the $CS_{max}$.

According to aspect (13), the glass-based article of any of aspects (1) to (12) is provided, wherein the $CS_{max}$ is greater than or equal to 800 MPa.

According to aspect (14), the glass-based article of any of aspects (1) to (13) is provided, wherein the $CS_{max}$ is greater than or equal to 820 MPa.

According to aspect (15), the glass-based article of any of aspects (1) to (14) is provided, wherein the $CS_{max}$ is greater than or equal to 850 MPa.

According to aspect (16), the glass-based article of any of aspects (1) to (15) is provided, wherein the PT is less than or equal to 60 MPa.

According to aspect (17), the glass-based article of any of aspects (1) to (16) is provided, wherein the PT is less than or equal to 55 MPa.

According to aspect (18), the glass-based article of any of aspects (1) to (17) is provided, wherein the PT is less than or equal to 50 MPa.

According to aspect (19), the glass-based article of any of aspects (1) to (18) is provided, wherein the PT is less than or equal to 45 MPa.

According to aspect (20), the glass-based article of any of aspects (1) to (19) is provided, wherein the PT is less than or equal to 40 MPa.

According to aspect (21), the glass-based article of any of aspects (1) to (20) is provided, wherein the PT is less than or equal to 35 MPa.

According to aspect (22), the glass-based article of any of aspects (1) to (21) is provided, wherein the PT is less than or equal to 30 MPa.

According to aspect (23), the glass-based article of any of aspects (1) to (22) is provided, wherein the $CS_k$ is greater than or equal to 40 MPa.

According to aspect (24), the glass-based article of any of aspects (1) to (23) is provided, wherein the $CS_k$ is greater than or equal to 50 MPa.

According to aspect (25), the glass-based article of any of aspects (1) to (24) is provided, wherein the $CS_k$ is greater than or equal to 60 MPa.

According to aspect (26), the glass-based article of any of aspects (1) to (25) is provided, wherein the $CS_k$ is less than or equal to 140 MPa.

According to aspect (27), the glass-based article of any of aspects (1) to (26) is provided, wherein the $CS_k$ is less than or equal to 130 MPa.

According to aspect (28), the glass-based article of any of aspects (1) to (27) is provided, wherein the $CS_k$ is less than or equal to 120 MPa.

According to aspect (29), the glass-based article of any of aspects (1) to (28) is provided, wherein the DOC is greater than or equal to 0.12 t.

According to aspect (30), the glass-based article of any of aspects (1) to (29) is provided, wherein the DOC is greater than or equal to 0.13 t.

According to aspect (31), the glass-based article of any of aspects (1) to (30) is provided, wherein the DOC is greater than or equal to 0.14 t.

According to aspect (32), the glass-based article of any of aspects (1) to (31) is provided, wherein the DOC is less than or equal to 0.18 t.

According to aspect (33), the glass-based article of any of aspects (1) to (32) is provided, wherein the DOC is less than or equal to 0.17 t.

According to aspect (34), the glass-based article of any of aspects (1) to (33) is provided, wherein the DOC is greater than or equal to 5 micrometers.

According to aspect (35), the glass-based article of any of aspects (1) to (34) is provided, wherein the DOC is less than or equal to 85 micrometers.

According to aspect (36), the glass-based article of any of aspects (1) to (35) is provided, wherein the $DOL_{sp}$ is greater than or equal to 4.5 micrometers and less than or equal to 24 micrometers.

According to aspect (37), the glass-based article of any of aspects (1) to (36) is provided, wherein a ratio of DOC/$DOL_{sp}$ is greater than or equal to 10 and less than or equal to 23.

According to aspect (38), the glass-based article of any of aspects (1) to (37) is provided, comprising a merit index (MI) defined by $CS*DOL*CS_k*DOC/PT^{0.5}$, wherein the MI is in the range of greater than or equal to $3 \times 10^6$ to less than or equal to $30 \times 10^6$ $MPa^2 \mu m^2 / MPa^{0.5}$.

According to aspect (39), the glass-based article of any of aspects (1) to (38) is provided, comprising a damage resistant force (DRF) ratio defined by $CS*DOL/CS_k*DOC$, wherein the DRF is in the range of greater than or equal to 0.1 to less than or equal to 5.

According to aspect (40), the glass-based article of any of aspects (1) to (39) is provided, wherein a $Li_2O$ concentration at the center of the glass-based-based article is less than or equal to 12 mol %.

According to aspect (41), the glass-based article of any of aspects (1) to (40) is provided, wherein a $Li_2O$ concentration at the center of the glass-based-based article is less than or equal to 11 mol %.

According to aspect (42), the glass-based article of any of aspects (1) to (41) is provided, wherein a $Li_2O$ concentration at the center of the glass-based-based article is less than or equal to 10 mol %.

According to aspect (43), the glass-based article of any of aspects (1) to (42) is provided, wherein a $Li_2O$ concentration at the center of the glass-based article is less than or equal to 9.5 mol %.

According to aspect (44), the glass-based article of any of aspects (1) to (43) is provided, wherein a $Li_2O$ concentration at the center of the glass-based-based article is less than or equal to 9 mol %.

According to aspect (45), the glass-based article of any of aspects (1) to (44) is provided, wherein a $Li_2O$ concentration at the center of the glass-based article is less than or equal to 8.5 mol %.

According to aspect (46), the glass-based article of any of aspects (1) to (45) is provided, wherein the $Li_2O$ concentration at the center of the glass-based article is less than or equal to 8 mol %.

According to aspect (47), the glass-based article of any of aspects (1) to (46) is provided, wherein the stress profile does not contain a region of negative second derivative of CS(t) at a depth of greater than or equal to $DOL_{sp}$ and less than or equal to DOC.

According to aspect (48), a glass-based article is provided. The glass-based article comprises: first and second surfaces defining a thickness (t), wherein the thickness is greater than or equal to 0.1 mm to less than or equal to 2 mm; and a stress profile comprising: a peak compressive stress (CS) greater than or equal to 800 MPa; a peak tension (PT) less than or equal to 61 MPa; a compressive stress at a knee ($CS_k$) greater than or equal to 25 MPa; a depth of compression (DOC) that is greater than or equal to 0.1 t; a spike region extending from the first surface to a depth of layer of a spike region ($DOL_{sp}$), where $DOL_{sp}$ is greater than or equal to 7 μm.

According to aspect (49), the glass-based article of aspect (48) is provided, wherein the CS is greater than or equal to 850 MPa.

According to aspect (50), the glass-based article of any of aspects (48) to the preceding aspect is provided, wherein the CS is less than or equal to 1000 MPa.

According to aspect (51), the glass-based article of any of aspects (48) to the preceding aspect is provided, wherein the PT is greater than or equal to 30 MPa.

According to aspect (52), the glass-based article of any of aspects (48) to the preceding aspect is provided, wherein the $CS_k$ is less than or equal to 140 MPa.

According to aspect (53), the glass-based article of any of aspects (48) to the preceding aspect is provided, wherein the DOC is less than or equal to 0.18 t.

According to aspect (54), the glass-based article of any of aspects (48) to the preceding aspect is provided, wherein the DOC is greater than or equal to 80 μm.

According to aspect (55), the glass-based article of any of aspects (48) to the preceding aspect is provided, wherein the DOC is less than or equal to 150 μm.

According to aspect (56), the glass-based article of any of aspects (48) to the preceding aspect is provided, wherein the $DOL_{sp}$ is less than or equal to 10 μm.

According to aspect (57), the glass-based article of any of aspects (48) to the preceding aspect is provided, wherein the $DOL_{sp}$ is greater than or equal to 0.0055t.

According to aspect (58), the glass-based article of any of aspects (48) to the preceding aspect is provided, wherein the $DOL_{sp}$ is less than or equal to 0.025 t.

According to aspect (59), the glass-based article of any of aspects (48) to the preceding aspect is provided, wherein the t is greater than or equal to 0.4 mm to less than or equal to 1.3 mm.

According to aspect (60), the glass-based article of any of aspects (48) to the preceding aspect is provided, wherein a value of $CS_k/t$ is greater than or equal to 40 MPa/mm.

According to aspect (61), the glass-based article of any of aspects (48) to the preceding aspect is provided, wherein the glass-based article comprises lithium.

According to aspect (62), the glass-based article of any of aspects (48) to the preceding aspect is provided, wherein a stress slope of the spike region is greater than or equal to 40 MPa/μm.

According to aspect (63), a consumer electronic product is provided. The consumer electronic product comprises: a housing comprising a front surface, a back surface, and side surfaces; electrical components provided at least partially within the housing, the electrical components comprising at least a controller, a memory, and a display, the display being provided at or adjacent the front surface of the housing; and a cover disposed over the display; wherein a portion of at least one of the housing and the cover comprises the glass-based article of any of aspects (1) to (62).

According to aspect (64), a method of manufacturing a glass-based article is provided. The method comprising: exposing a glass-based substrate to a single molten salt bath to form the glass-based article, wherein the glass-based substrate contains lithium, the glass-based substrate has opposing first and second surfaces defining a substrate thickness (t) and the molten bath comprises: potassium nitrate ($KNO_3$); and potassium carbonate ($K_2CO_3$) that is dissolved in the molten bath; wherein the concentration of the $K_2CO_3$ remains at or below its solubility limit in the molten bath, and the concentration of lithium ions in the molten bath remains at or below its solubility limit in the molten bath.

According to aspect (65), the method of aspect (64) is provided, wherein the molten salt bath further comprises: sodium nitrate ($NaNO_3$); and sodium carbonate ($Na_2CO_3$) that is dissolved in the molten bath; wherein the concentration of the $Na_2CO_3$ remains at or below its solubility limit in the molten bath.

According to aspect (66), the method of any of aspects (64) to (65) is provided, wherein the glass-based article comprises a peak compressive stress (CS) greater than or equal to 700 MPa; a peak tension (PT) less than or equal to 50 MPa; a compressive stress at a knee ($CS_k$); and a depth of compression (DOC) that is greater than or equal to 0.1 t.

According to aspect (67), the method of any of aspects (64) to (66) is provided, further comprising increasing the CS without decreasing the $CS_k$ relative to exposing the glass-based substrate to a bath comprising the $KNO_3$ salt in the absence of the $K_2CO_3$ salt.

According to aspect (68), the method of any of aspects (64) to (67) is provided, further comprising increasing the CS without decreasing the PT relative to exposing the glass-based substrate to a bath comprising the $KNO_3$ salt in the absence of the $K_2CO_3$ salt.

According to aspect (69), the method of any of aspects (64) to (68) is provided, further comprising increasing the $CS_k$ without decreasing the CS relative to exposing the glass-based substrate to a bath comprising the $KNO_3$ salt in the absence of the $K_2CO_3$ salt.

According to aspect (70), the method of any of aspects (64) to (69) is provided, further comprising increasing the $CS_k$ without decreasing the CS relative to exposing the glass-based substrate to a bath comprising the $KNO_3$ salt in the absence of the $K_2CO_3$ salt.

According to aspect (71), the method of any of aspects (64) to (70) is provided, further comprising reducing the CS degradation as to an increase of Li poisoning ion concentration relative to exposing the glass-based substrate to a bath comprising the $KNO_3$ salt in the absence of the $K_2CO_3$ salt.

According to aspect (72), the method of any of aspects (64) to (71) is provided, further comprising reducing the $CS_k$ degradation as to an increase of Li poisoning ion concentration relative to exposing the glass-based substrate to a bath comprising the $KNO_3$ salt in the absence of the $K_2CO_3$ salt.

According to aspect (73), the method of any of aspects (64) to (72) is provided, further comprising reducing the PT degradation as to an increase of Li poisoning ion concentration relative to exposing the glass-based substrate to a bath comprising the $KNO_3$ salt in the absence of the $K_2CO_3$ salt.

According to aspect (74), the method of any of aspects (64) to (73) is provided, further comprising maintaining weight gain as to an increase of Li poisoning ion concentration relative to exposing the glass-based substrate to a bath comprising the $KNO_3$ salt in the absence of the $K_2CO_3$ salt.

According to aspect (75), the method of any of aspects (64) to (74) is provided, further comprising increasing a merit index (MI) defined by $CS*DOL*CSk*DOC/PT^{0.5}$ relative to exposing the glass-based substrate to a bath comprising the $KNO_3$ salt in the absence of the $K_2CO_3$ salt.

According to aspect (76), a method of manufacturing a glass-based article is provided. The method comprising: exposing a glass-based substrate to a single molten salt bath to form the glass-based article, wherein the glass-based article is the glass-based article of any of aspects (1) to (62).

Additional features and advantages will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

DETAILED DESCRIPTION

Figure 1:
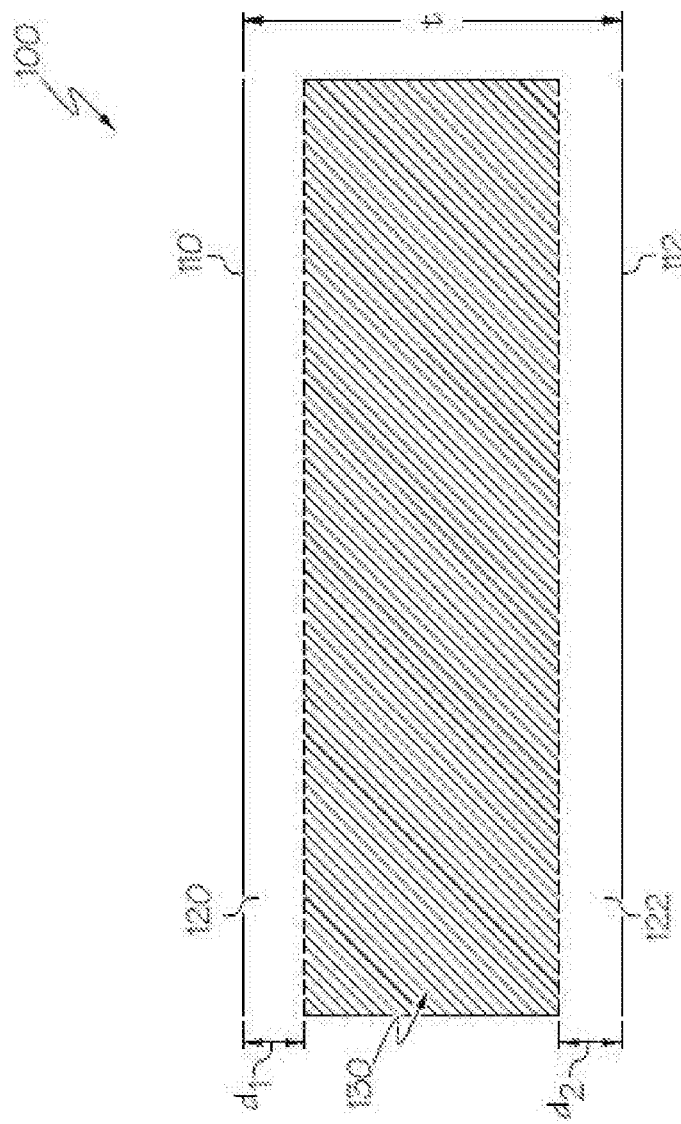
FIG. 1 schematically depicts a cross section of a glass having compressive stress layers on surfaces thereof according to embodiments disclosed and described herein.

Before describing several exemplary embodiments, it is to be understood that the disclosure is not limited to the details of construction or process steps set forth in the following disclosure. The disclosure provided herein is capable of other embodiments and of being practiced or being carried out in various ways.

Reference throughout this specification to "one embodiment," "certain embodiments," "various embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in various embodiments," "in one embodiment" or "in an embodiment" in various places throughout this specification are not necessarily referring to the same embodiment, or to only one embodiment. Furthermore, the particular features, structures, materials, or characteristics may be combined in any suitable manner in one or more embodiments.

Definitions and Measurement Techniques

The terms "glass-based article" and "glass-based substrates" are used to include any object made wholly or partly of glass, including glass-ceramics (including an amorphous phase and a crystalline phase). As utilized herein, a "glass-based substrate" refers to an as formed substrate that may be then be subjected to a strengthening process to form a "glass-based article." Laminated glass-based articles and substrates may include laminates of glass and non-glass materials, laminates of glass-ceramics and non-glass materials, laminates of glass-ceramics and crystalline materials, and/or laminates of glass and crystalline materials. Glass-based substrates according to one or more embodiments can be selected from soda-lime silicate glass, alkali-alumino silicate glass, alkali-containing borosilicate glass, alkali-containing aluminoborosilicate glass, and alkali-containing glass-ceramics.

A "base composition" is a chemical make-up of a substrate prior to any ion exchange (IOX) treatment. That is, the base composition is undoped by any ions from IOX. A composition at the center of a glass-based article that has been IOX treated is close to or the same as the base composition when IOX treatment conditions are such that ions supplied for IOX do not diffuse into the center of the substrate. In one or more embodiments, a central composition at the center of the glass-based article comprises the base composition.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue. Thus, for example, a glass-based article that is "substantially free of MgO" is one in which MgO is not actively added or batched into the glass-based article, but may be present in very small amounts as a contaminant. As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about." It will be further understood that the endpoints of each of the ranges are significant both in relation to the other endpoint, and independently of the other endpoint.

Unless otherwise specified, all compositions described herein are expressed in terms of mole percent (mol %) on an oxide basis.

Reference to "poisoning ions" means small monovalent ions (like $Na^+$ or $Li^+$) eluted from the glass-based substrate during the ion exchange or some bivalent ions (like $Ca^{2+}$ and $Mg^{2+}$) as residual contaminants existing in the salt. Poisoning ions may interfere with salt bath ions present for ion exchange.

A "stress profile" is a plot of stress as a function of depth across the thickness of a glass-based article. A compressive stress region, where the article is under compressive stress, extends from a first surface to a depth of compression (DOC) of the article. A central tension region extends from the DOC and includes the region where the glass-based article is under tensile stress.

As used herein, depth of compression (DOC) refers to the depth at which the stress within the glass-based article changes from compressive to tensile stress. At the DOC, the stress crosses from a positive (compressive) stress to a negative (tensile) stress and thus exhibits a stress value of zero. According to the convention normally used in mechanical arts, compression is expressed as a negative (<0) stress and tension is expressed as a positive (>0) stress. Throughout this description, however, positive values of stress are compressive stress (CS), which are expressed as a positive or absolute value—i.e., as recited herein, CS=|CS|. Additionally, negative values of stress are tensile stress. But when used with the term "tensile", stress or central tension (CT) may be expressed as a positive value, i.e., CT=|CT| Central tension (CT) refers to tensile stress in a central region or a central tension region of the glass-based article. Peak central tension (maximum CT or PT) refers to the maximum tensile stress in the central tension region. In embodiments, maximum PT occurs in the central tension region nominally at 0.5·t, where t is the article thickness. Stated differently, peak tension (PT) refers to maximum tensile stress measured, which may or may not be at the center of the article.

Figure 2:
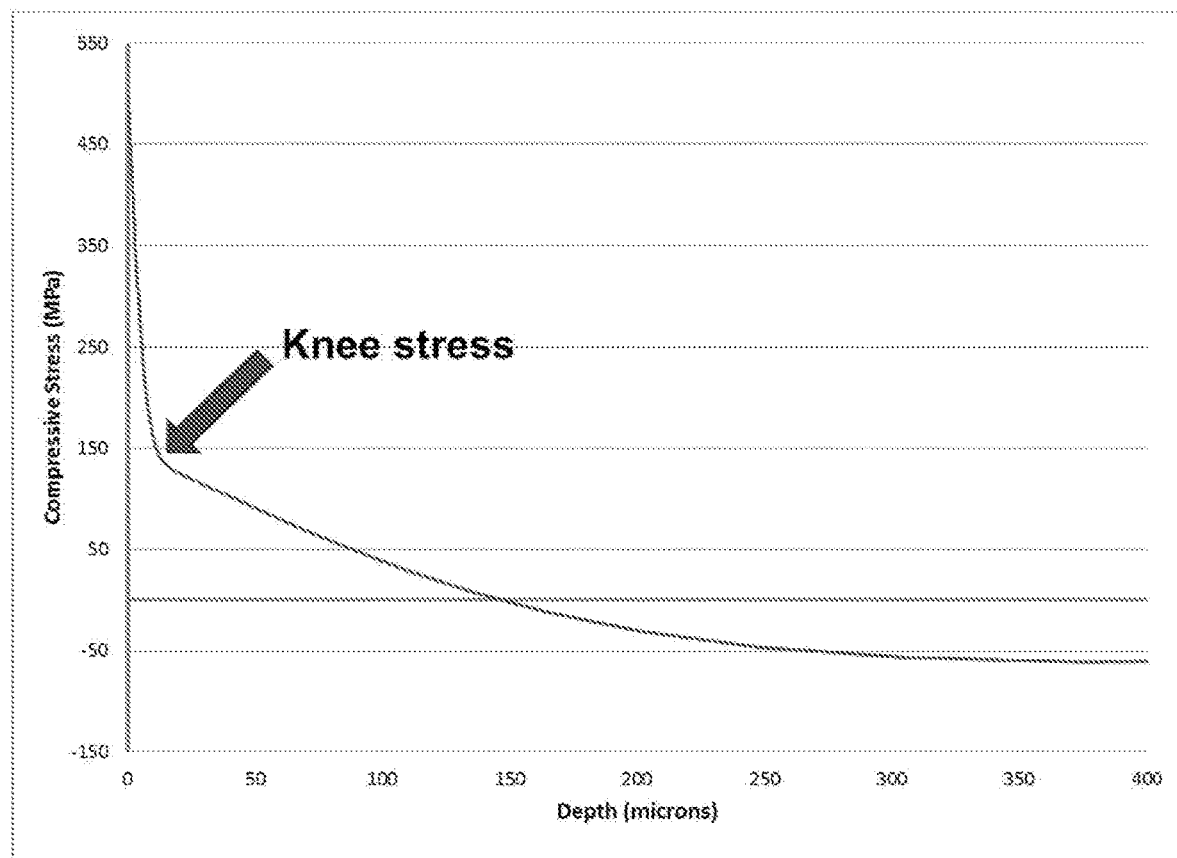
FIG. 2 is a schematic representation of a stress profile including a knee stress.
Figure 3A:
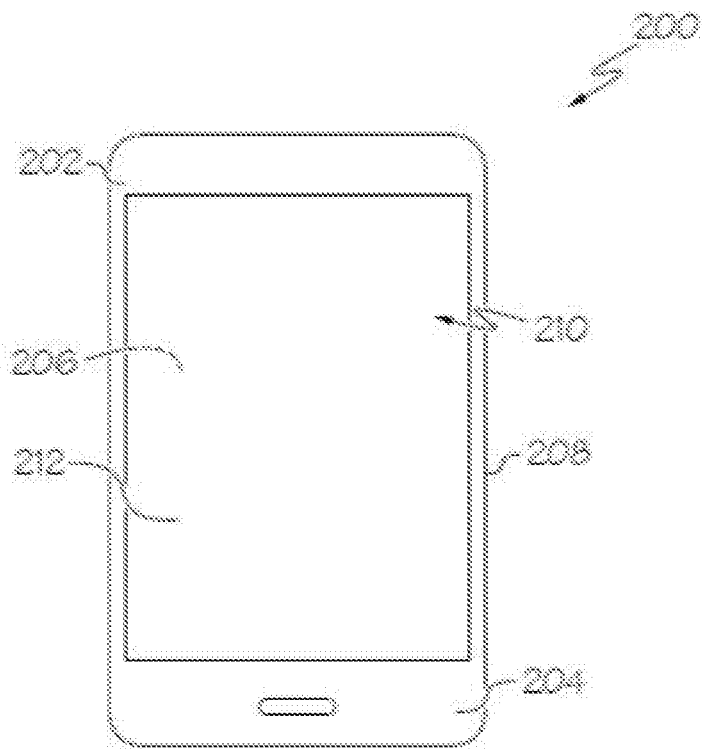
FIG. 3A is a plan view of an exemplary electronic device incorporating any of the glass articles disclosed herein.
Figure 3B:
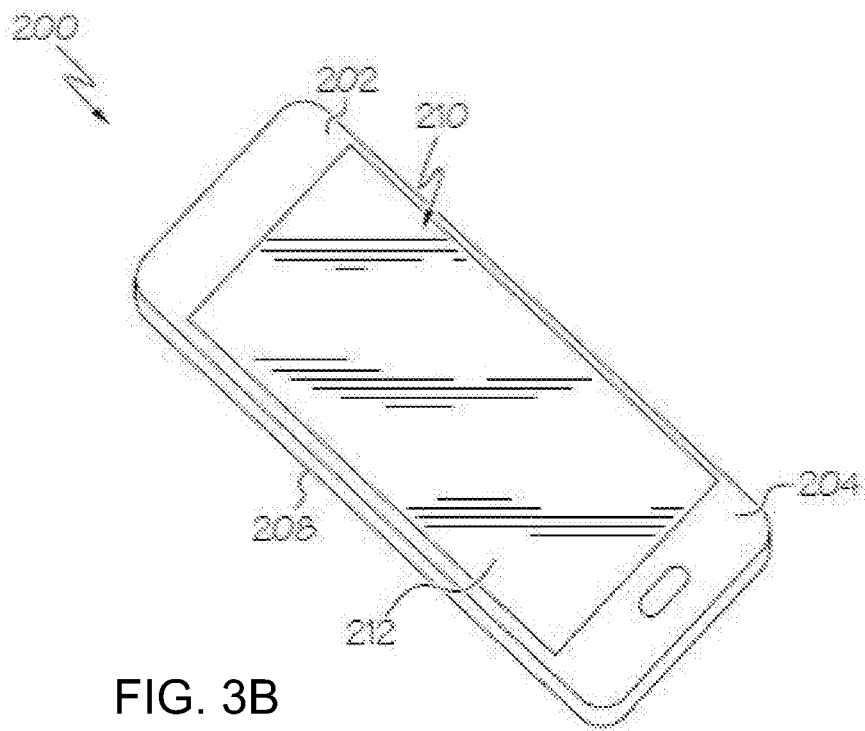
FIG. 3B is a perspective view of the exemplary electronic device of FIG. 3A.

A "knee" of a stress profile is a region of an article where the slope of the stress profile transitions from steep (a spike region) to gradual (a deep region). The steep portion of the stress profile extending from the surface into the glass-based article is referred to as the "spike." The knee may refer to a transition area over a span of depths where the slope is changing. The knee compressive stress ($CS_k$) is defined as the value of compressive stress that the deeper portion of the CS profile extrapolates to at the depth of spike ($DOL_{sp}$). The $DOL_{sp}$ is reported as measured by a surface-stress meter by known methods. A schematic representation of a stress profile including a knee stress is provided in FIG. 2.

A non-zero metal oxide concentration that varies from the first surface to a depth of layer (DOL) with respect to the metal oxide or that varies along at least a substantial portion of the article thickness (t) indicates that a stress has been generated in the article as a result of ion exchange. The variation in metal oxide concentration may be referred to herein as a metal oxide concentration gradient. The metal oxide that is non-zero in concentration and varies from the first surface to a DOL or along a portion of the thickness may be described as generating a stress in the glass-based article. The concentration gradient or variation of metal oxides is created by chemically strengthening a glass-based substrate in which a plurality of first metal ions in the glass-based substrate is exchanged with a plurality of second metal ions.

As used herein, the terms "depth of exchange", "depth of layer" (DOL), "chemical depth of layer", and "depth of chemical layer" may be used interchangeably, describing in general the depth at which ion exchange facilitated by an ion exchange process (IOX) takes place for a particular ion. DOL refers to the depth within a glass-based article (i.e., the distance from a surface of the glass-based article to its interior region) at which an ion of a metal oxide or alkali metal oxide (e.g., the metal ion or alkali metal ion) diffuses into the glass-based article where the concentration of the ion reaches a minimum value, as determined by Glow Discharge-Optical Emission Spectroscopy (GD-OES)). In some embodiments, the DOL is given as the depth of exchange of the slowest-diffusing or largest ion introduced by an ion exchange (IOX) process.

Unless otherwise specified, PT and CS are expressed herein in megaPascals (MPa), thickness is expressed in millimeters and DOC and DOL are expressed in microns (micrometers).

Compressive stress (including peak CS, $CS_{max}$) and $DOL_{sp}$ are measured by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. SOC in turn is measured according to Procedure C (Glass Disc Method) described in ASTM standard C770-16, entitled "Standard Test Method for Measurement of Glass Stress-Optical Coefficient," the contents of which are incorporated herein by reference in their entirety. Unless otherwise indicated, values for CS provided herein refer to the peak compressive stress $CS_{max}$ of the glass-based article.

Compressive stress at the knee ($CS_k$) may be measured by a method according to U.S. patent application Ser. No. 16/015,776, filed Jun. 22, 2018 titled "Methods of Improving the Measurement of Knee Stress in Ion-Exchanged Chemically Strengthened Glasses Containing Lithium," which is incorporated herein by reference in its entirety.

The maximum central tension (CT) or peak tension (PT) and stress retention values are measured using a scattered light polariscope (SCALP) technique known in the art. The Refracted near-field (RNF) method or SCALP may be used to measure the stress profile and the depth of compression (DOC). When the RNF method is utilized to measure the stress profile, the maximum CT value provided by SCALP is utilized in the RNF method. In particular, the stress profile measured by RNF is force balanced and calibrated to the maximum CT value provided by a SCALP measurement. The RNF method is described in U.S. Pat. No. 8,854,623, entitled "Systems and methods for measuring a profile characteristic of a glass sample", which is incorporated herein by reference in its entirety. In particular, the RNF method includes placing the glass article adjacent to a reference block, generating a polarization-switched light beam that is switched between orthogonal polarizations at a rate of from 1 Hz to 50 Hz, measuring an amount of power in the polarization-switched light beam and generating a polarization-switched reference signal, wherein the measured amounts of power in each of the orthogonal polarizations are within 50% of each other. The method further includes transmitting the polarization-switched light beam through the glass sample and reference block for different depths into the glass sample, then relaying the transmitted polarization-switched light beam to a signal photodetector using a relay optical system, with the signal photodetector generating a polarization-switched detector signal. The method also includes dividing the detector signal by the reference signal to form a normalized detector signal and determining the profile characteristic of the glass sample from the normalized detector signal.

General Overview of Properties of Glass-Based Articles

Glass-based articles herein have stress profiles that are designed to provide desirable stress profile characteristics and excellent drop performance and damage resistance. The stress profiles include increased compressive stresses, for example, high peak compressive stress ($CS_{max}$) and high knee stress ($CS_k$), separately or in combination with other parameters. Desirable depth of compression (DOC) and spike depth of layer ($DOL_{sp}$), separately or in combination with other parameters, are also achieved. Peak tensions (PT) of desired values are also obtained.

The glass-based articles herein are formed by a single ion exchange strengthening (SIOX) method, which is advantageous in creating a high peak CS in conjunction with desirable $CS_k$ and PT. SIOX treatments may be enhanced by the inclusion of additional salts that are dissolvable/highly soluble in conventional molten salt IOX baths. For example, in combination with conventional nitrate salts for a desired metal, an additional salt, for example, a carbonate, sulfate, chloride, fluorine, borate, and/or phosphate salt for the same metal is dissolved in the nitrate salt and is present during SIOX. The additional salt remains at or below its solubility limit in the nitrate salt. Any poisoning ions remain at or below their solubility limits in the bath mixture. Use of additional salt types and amounts may be tailored to the type of glass-based substrates being processed.

The glass-based articles herein, whose underlying glass-based substrates were strengthened by SIOX of a relatively short duration, have a relatively small depth of potassium layer (DOL), which provide 1.5 to 2 times better drop performance relative to a comparative glass-based article, whose glass-based substrate was strengthened by SIOX of an approximate 5-fold longer duration, which have a deeper depth of potassium layer (DOL).

Methods herein can lower processing costs due to shorter IOX times and longer IOX bath life.

Reference will now be made in detail to alkali aluminosilicate glasses and stress profiles therefore according to various embodiments. In one or more embodiments, the glass-based articles are lithium aluminosilicate glasses. Alkali aluminosilicate glasses have good ion exchangeability, and chemical strengthening processes have been used to achieve high strength and high toughness properties in alkali aluminosilicate glasses. Sodium aluminosilicate glasses are highly ion exchangeable glasses with high glass formability and quality. Lithium aluminosilicate glasses are highly ion exchangeable glasses with high glass quality. The substitution of $Al_2O_3$ into the silicate glass network increases the interdiffusivity of monovalent cations during ion exchange. By chemical strengthening in a molten salt bath (e.g., $KNO_3$ or $NaNO_3$), glasses with excellent drop performance can be achieved. The stress profiles achieved through chemical strengthening may have a variety of shapes that increase the drop performance, strength, toughness, and other attributes of the glass articles.

Therefore, lithium aluminosilicate glasses with good physical properties, chemical durability, and ion exchangeability have drawn attention for use as cover glass. Through different ion exchange processes, greater peak tension (PT), depth of compression (DOC), and high compressive stress (CS) can be achieved. The stress profiles described herein provide excellent drop performance for glass-based articles, including but not limited to lithium-containing glass articles.

In embodiments of glass compositions described herein, the concentration of constituent components (e.g., $SiO_2$, $Al_2O_3$, $Li_2O$, and the like) are given in mole percent (mol %) on an oxide basis, unless otherwise specified. It should be understood that any of the variously recited ranges of one component may be individually combined with any of the variously recited ranges for any other component.

Disclosed herein are stress profiles for alkali aluminosilicate glass compositions. With reference to FIG. 1, the glass has a first region under compressive stress (e.g., first and second compressive stress layers 120, 122 in FIG. 1) extending from the surface to a depth of compression (DOC) of the glass and a second region (e.g., central region 130 in FIG. 1) under a tensile stress or central tension (CT) extending from the DOC into the central or interior region of the glass.

The compressive stress (CS) has a maximum or peak value, which typically occurs at the surface of the glass (but such need not be the case as the peak may occur at a depth from the surface of the glass), and the CS varies with distance d from the surface according to a function. Referring again to FIG. 1, the first compressive stress layer 120 extends from first surface 110 to a depth $d_1$ and a second compressive stress layer 122 extends from second surface 112 to a depth $d_2$. Together, these segments define a compression or CS of glass 100.

The compressive stress of both major surfaces (110, 112 in FIG. 1) is balanced by stored tension in the central region (130) of the glass.

The knee stress $CS_k$ is defined as the value of compressive stress that the deeper portion of the CS profile extrapolates to at the depth $DOL_{sp}$. The depth of the spike $DOL_{sp}$ is reported as measured by a surface-stress meter by known methods utilizing the number of fringes in a prism-coupling angular-coupling spectrum that correspond to guided optical modes in said CS-spike region. When $DOL_{sp}$ is less than about 5.5 μm, the measurement wavelength may be less than 590 nm to enable measuring at least 2 such fringes in one polarization state. For example, the measurement wavelength may be 545 nm, or even 365 nm. If $DOL_{sp}$ is less than about 4 μm, $DOL_{sp}$ may be estimated accurately when the CS spike is the result of substantial enrichment of the near-surface layer in larger ions such as potassium (K) when compared to the smaller ions in the glass such as Na or Li. In that case $DOL_{sp}$ may be considered to be the depth where the concentration of such larger ions has dropped to a level where its further decay with depth can be considered negligible (e.g., dropped 90% of the way from the maximum K concentration to the baseline level occurring in the next 20 μm of depth). A schematic representation of a stress profile including a knee stress is provided in FIG. 2.

In the glass-based articles, there is an alkali metal oxide having a non-zero concentration that varies from one or both of first and second surfaces to a depth of layer (DOL) with respect to the metal oxide. A stress profile is generated due to the non-zero concentration of the metal oxide(s) that varies from the first surface. The non-zero concentration may vary along a portion of the article thickness. In some embodiments, the concentration of the alkali metal oxide is non-zero and varies, both along a thickness range from about 0·t to about 0.3·t. In some embodiments, the concentration of the alkali metal oxide is non-zero and varies along a thickness range from about 0·t to about 0.35·t, from about 0·t to about 0.4·t, from about 0·t to about 0.45·t, from about 0·t to about 0.48·t, or from about 0·t to about 0.50·t. The variation in concentration may be continuous along the above-referenced thickness ranges. Variation in concentration may include a change in metal oxide concentration of about 0.2 mol % or more along a thickness segment of about 100 micrometers. The change in metal oxide concentration may be about 0.3 mol % or more, about 0.4 mol % or more, or about 0.5 mol % or more along a thickness segment of about 100 micrometers. This change may be measured by known methods in the art including microprobe.

In some embodiments, the variation in concentration may be continuous along thickness segments in the range from about 10 micrometers to about 30 micrometers. In some embodiments, the concentration of the alkali metal oxide decreases from the first surface to a value between the first surface and the second surface and increases from the value to the second surface.

The concentration of alkali metal oxide may include more than one metal oxide (e.g., a combination of $Na_2O$ and $K_2O$). In some embodiments, where two metal oxides are utilized and where the radius of the ions differ from one or another, the concentration of ions having a larger radius is greater than the concentration of ions having a smaller radius at shallow depths, while at deeper depths, the concentration of ions having a smaller radius is greater than the concentration of ions having larger radius.

In one or more embodiments, the alkali metal oxide concentration gradient extends through a substantial portion of the thickness t of the article. In some embodiments, the concentration of the metal oxide may be about 0.5 mol % or greater (e.g., about 1 mol % or greater) along the entire thickness of the first and/or second section, and is greatest at a first surface and/or a second surface 0·t and decreases substantially constantly to a value between the first and second surfaces. At that value, the concentration of the metal oxide is the least along the entire thickness t; however the concentration is also non-zero at that point. In other words, the non-zero concentration of that particular metal oxide extends along a substantial portion of the thickness t (as described herein) or the entire thickness t. The total concentration of the particular metal oxide in the glass-based article may be in the range from about 1 mol % to about 20 mol %.

The concentration of the alkali metal oxide may be determined from a baseline amount of the metal oxide in the glass-based substrate ion exchanged to form the glass-based article.

In one or more embodiments, the glass-based articles herein comprise a maximum compressive stress ($CS_{max}$) of greater than or equal to 700 MPa, such as greater than or equal to 750 MPa, greater than or equal to 800 MPa, greater than or equal to 810 MPa, greater than or equal to 820 MPa, greater than or equal to 830 MPa, greater than or equal to 840 MPa, greater than or equal to 850 MPa, greater than or equal to 860 MPa, greater than or equal to 870 MPa, greater than or equal to 880 MPa, greater than or equal to 890 MPa, greater than or equal to 900 MPa, greater than or equal to 910 MPa, greater than or equal to 920 MPa, greater than or equal to 930 MPa, greater than or equal to 940 MPa, greater than or equal to 950 MPa, greater than or equal to 960 MPa, greater than or equal to 970 MPa, greater than or equal to 980 MPa, greater than or equal to 990 MPa, greater than or equal to 1000 MPa, or more, and all values and sub-ranges therebetween. In embodiments, the glass-based articles may have a maximum compressive stress ($CS_{max}$) of less than or equal to 1000 MPa, such as less than or equal to 990 MPa, less than or equal to 980 MPa, less than or equal to 970 MPa, less than or equal to 960 MPa, less than or equal to 950 MPa, less than or equal to 940 MPa, less than or equal to 930 MPa, less than or equal to 920 MPa, less than or equal to 910 MPa, less than or equal to 900 MPa, less than or equal to 890 MPa, less than or equal to 880 MPa, less than or equal to 870 MPa, less than or equal to 860 MPa, less than or equal to 850 MPa, less than or equal to 840 MPa, less than or equal to 830 MPa, less than or equal to 820 MPa, less than or equal to 810 MPa, less than or equal to 800 MPa, or less, and all values and sub-ranges therebetween. In embodiments, the glass-based articles may have a maximum compressive stress ($CS_{max}$) of greater than or equal to 700 MPa to less than or equal to 1000 MPa, such as greater than or equal to 800 MPa to less than or equal to 1000 MPa, greater than or equal to 810 MPa to less than or equal to 990 MPa, greater than or equal to 820 MPa to less than or equal to 980 MPa, greater than or equal to 830 MPa to less than or equal to 970 MPa, greater than or equal to 840 MPa to less than or equal to 960 MPa, greater than or equal to 850 MPa to less than or equal to 950 MPa, greater than or equal to 860 MPa to less than or equal to 940 MPa, greater than or equal to 970 MPa to less than or equal to 930 MPa, greater than or equal to 880 MPa to less than or equal to 920 MPa, greater than or equal to 890 MPa to less than or equal to 910 MPa, greater than or equal to 900 MPa to less than or equal to 1000 MPa, and any and all sub-ranges formed from any of these endpoints. The high peak compressive stress of the glass-based articles described herein provides improved resistance to fracture, which may be demonstrated by improved performance in drop testing. In embodiments, the peak compressive stress may be located at a surface of the glass-based article.

In one or more embodiments, the glass-based articles herein comprise a peak tension (PT) of less than or equal to 61 MPa, such as less than or equal to 60 MPa, less than or equal to 55 MPa, less than or equal to 50 MPa, less than or equal to 45 MPa, less than or equal to 40 MPa, less than or equal to 35 MPa, less than or equal to 30 MPa, and all values and subranges therebetween. In embodiments, the glass-based articles have a PT of greater than or equal to 30 MPa, such as greater than or equal to 35 MPa, greater than or equal to 40 MPa, greater than or equal to 45 MPa, greater than or equal to 50 MPa, greater than or equal to 55 MPa, greater than or equal to 60 MPa, and all values and subranges therebetween. In embodiments, the glass-based articles have a PT of greater than or equal to 30 MPa to less than or equal to 61 MPa, such as greater than or equal to 35 MPa to less than or equal to 60 MPa, greater than or equal to 40 MPa to less than or equal to 55 MPa, greater than or equal to 45 MPa to less than or equal to 50 MPa, and any and all subranges formed from any of these endpoints. The PT of the glass-based articles is associated with reduced IOX treatment times and ensures that the glass-based articles do not exhibit undesirable fracture behavior, such as frangibility.

In one or more embodiments, the glass-based articles herein comprise a compressive stress at a knee ($CS_k$) of greater than or equal to 25 MPa, such as greater than or equal to 30 MPa, greater than or equal to 35 MPa, greater than or equal to 40 MPa, greater than or equal to 45 MPa, greater than or equal to 50 MPa, greater than or equal to 55 MPa, greater than or equal to 60 MPa, or more, and all values and sub-ranges therebetween. In embodiments, the glass-based articles have a $CS_k$ of less than or equal to 140 MPa, such as less than or equal to 130 MPa, less than or equal to 120 MPa, less than or equal to 110 MPa, less than or equal to 100 MPa, less than or equal to 90 MPa, less than or equal to 80 MPa, less than or equal to 70 MPa, less than or equal to 60 MPa, less than or equal to 55 MPa, less than or equal to 50 MPa, less than or equal to 45 MPa, or less, and all values and sub-ranges therebetween. In embodiments, the glass-based articles have a $CS_k$ of greater than or equal to 25 MPa to less than or equal to 140 MPa, such as greater than or equal to 30 MPa to less than or equal to 130 MPa, greater than or equal to 35 MPa to less than or equal to 120 MPa, greater than or equal to 40 MPa to less than or equal to 110 MPa, greater than or equal to 45 MPa to less than or equal to 100 MPa, greater than or equal to 50 MPa to less than or equal to 90 MPa, greater than or equal to 55 MPa to less than or equal to 80 MPa, greater than or equal to 60 MPa to less than or equal to 80 MPa, and any and all subranges formed from any of these endpoints. The high $CS_k$ of the glass-based articles provides increased fracture resistance, which may be demonstrated by improved drop performance. If the $CS_k$ is too low, the glass-based articles may not exhibit the desired drop performance.

In embodiments, the glass-based articles may have a value of $CS_k/t$ of greater than or equal to 40 MPa/mm, such as greater than or equal to 45 MPa/mm, greater than or equal to 50 MPa/mm, greater than or equal to 55 MPa/mm, greater than or equal to 60 MPa/mm, greater than or equal to 65 MPa/mm, greater than or equal to 70 MPa/mm, greater than or equal to 75 MPa/mm, or more, and any and all subranges formed with any of these values as endpoints. In general, the $CS_k$ value that produces the desired fracture resistance, as indicated by drop performance, increases with increasing thickness. By placing limits on the value of $CS_k/t$, the desired fracture resistance of the glass-based articles may be achieved for various thicknesses.

In one or more embodiments, the glass-based articles herein comprise a depth of compression (DOC) that is greater than or equal to 10% of the article's thickness (t). For example, the glass-based articles may have a DOC of greater than or equal to 11% of t, such as greater than or equal to 12% of t, greater than or equal to 13% of t, greater than or equal to 14% of t, or more, and all values and sub-ranges therebetween; and/or a DOC of less than or equal to 18% of t, such as less than or equal to 17% of t, less than or equal to 16% of t, or less, and all values and sub-ranges therebetween. In embodiments, the glass-based articles have a DOC that is greater than or equal to 10% of t to less than or equal to 18% of t, such as greater than or equal to 11% of t to less than or equal to 17% of t, greater than or equal to 12% of t to less than or equal to 16% of t, greater than or equal to 13% of t to less than or equal to 15% of t, 15% of t, or any and all subranges formed from any of these endpoints.

In one or more embodiments, the glass-based articles herein comprise a DOC that is greater than or equal to 5 micrometers, such as greater than or equal to 10 micrometers, greater than or equal to 20 micrometers, greater than or equal to 30 micrometers, greater than or equal to 40 micrometers, greater than or equal to 50 micrometers, greater than or equal to 60 micrometers, greater than or equal to 70 micrometers, or more, and all values and sub-ranges therebetween; and/or a DOC that is less than or equal to 85 micrometers, less than or equal to 80 micrometers, or less, and all values and sub-ranges therebetween. In embodiments, the glass-based articles have a DOC that is greater than or equal to 80 µm to less than or equal to 150 µm, such as greater than or equal to 85 µm to less than or equal to 145 µm, greater than or equal to 90 µm to less than or equal to 140 µm, greater than or equal to 95 µm to less than or equal to 135 µm, greater than or equal to 100 µm to less than or equal to 130 µm, greater than or equal to 105 µm to less than or equal to 125 µm, greater than or equal to 110 µm to less than or equal to 120 µm, 115 µm, or any and all subranges formed from these endpoints. If the DOC is too low, such as below the aforementioned ranges, the glass-based articles may not exhibit the desired fracture resistance or drop performance.

In one or more embodiments, the glass-based articles herein have a thickness (t) in the range of 0.1 mm to 10 mm, 0.2 mm to 9 mm, 0.3 mm to 8 mm, 0.4 mm to 7 mm, 0.5 mm to 6 mm, 0.6 mm to 5 mm, 0.7 mm to 4 mm, 0.8 mm to 3 mm, 0.9 mm to 2 mm, and 1 mm to 1.9 mm, and all values and sub-ranges therebetween. In an embodiment, t is greater than or equal to 0.35 mm and less than or equal to 1 mm. In embodiments, the glass-based articles a thickness (t) of greater than or equal to 0.1 µm to less than or equal to 2 mm, such as greater than or equal to 0.2 µm to less than or equal to 1.9 mm, greater than or equal to 0.2 µm to less than or equal to 1.8 mm, greater than or equal to 0.3 µm to less than or equal to 1.7 mm, greater than or equal to 0.4 µm to less than or equal to 1.6 mm, greater than or equal to 0.5 µm to less than or equal to 1.5 mm, greater than or equal to 0.6 µm to less than or equal to 1.4 mm, greater than or equal to 0.7 µm to less than or equal to 1.3 mm, greater than or equal to 0.8 µm to less than or equal to 1.2 mm, greater than or equal to 0.9 µm to less than or equal to 1.1 mm, greater than or equal to 0.4 µm to less than or equal to 0.8 mm, greater than or equal to 0.4 µm to less than or equal to 1.3 mm, 1 mm, and any and all subranges formed from any of these endpoints.

In one or more embodiments, the glass-based articles herein comprise a depth of layer of a spike ($DOL_{sp}$) that is greater than or equal to 0.5% of the article's thickness (t), such as greater than or equal to 0.6% of t, greater than or equal to 0.7% of t, greater than or equal to 0.8% of t, such as greater than or equal to 0.9% of t, greater than or equal to 1% of t, greater than or equal to 1.1% of t, greater than or equal to 1.2% of t, greater than or equal to 1.3% of t, greater than or equal to 1.4% of t, greater than or equal to 1.5% of t, greater than or equal to 1.6% of t, greater than or equal to 1.7% of t, greater than or equal to 1.8% of t, greater than or equal to 1.9% of t, greater than or equal to 2% of t, greater than or equal to 2.1% of t, greater than or equal to 2.2% of t, greater than or equal to 2.3% of t, greater than or equal to 2.4% of t, or more, and all values and sub-ranges therebetween. In embodiments, the glass-based articles have a $DOL_{sp}$ of less than or equal to 4.8% of t, such as less than or equal to 3.5% of t, less than or equal to 3.25% of t, less than or equal to 3% of t, less than or equal to 2.75% of t, less than or equal to 2.5% of t, less than or equal to 2.4% of t, less than or equal to 2.3% of t, less than or equal to 2.2% of t, less than or equal to 2.1% of t, less than or equal to 2.0% of t, less than or equal to 1.9% of t, less than or equal to 1.8% of t, less than or equal to 1.7% of t, less than or equal to 1.6% of t, less than or equal to 1.5% of t, less than or equal to 1.4% of t, less than or equal to 1.3% of t, less than or equal to 1.2% of t, less than or equal to 1.1% of t, less than or equal to 1% of t, less than or equal to 0.9% of t, less than or equal to 0.8% of t, less than or equal to 0.7% of t, less than or equal to 0.6% of t, or less, and all values and sub-ranges therebetween. In embodiments, the glass-based articles have a $DOL_{sp}$ of greater than or equal to 0.5% of t to less than or equal to 4.8% of t, such as greater than or equal to 0.5% of t to less than or equal to 2.5% of t, greater than or equal to 0.6% of t to less than or equal to 2.4% of t, greater than or equal to 0.7% of t to less than or equal to 2.3% of t, greater than or equal to 0.8% of t to less than or equal to 2.2% of t, greater than or equal to 0.9% of t to less than or equal to 2.1% of t, greater than or equal to 1% of t to less than or equal to 2% of t, greater than or equal to 1.1% of t to less than or equal to 1.9% of t, greater than or equal to 1.2% of t to less than or equal to 1.8% of t, greater than or equal to 1.3% of t to less than or equal to 1.7% of t, greater than or equal to 1.4% of t to less than or equal to 1.6% of t, 1.5% of t, and any and all subranges formed from any of these endpoints.

In one or more embodiments, the glass-based articles herein comprise a $DOL_{sp}$ that is greater than or equal to 4.5 μm, such as greater than or equal to 5 μm, greater than or equal to 5.6 μm, greater than or equal to 5.6 μm, greater than or equal to 6 μm, greater than or equal to 6.5 μm, greater than or equal to 7 μm, greater than or equal to 7.5 μm, greater than or equal to 8 μm, greater than or equal to 8.5 μm, greater than or equal to 9 μm, or more, and all values and sub-ranges therebetween; and/or a $DOL_{sp}$ that is less than or equal to 24 μm, less than or equal to 22 μm, less than or equal to 20 μm, less than or equal to 18 μm, less than or equal to 16 μm, less than or equal to 14 μm, less than or equal to 12 μm, less than or equal to 10 μm, or less, and all values and sub-ranges therebetween. In embodiments, the glass-based substrates have a $DOL_{sp}$ that is greater than or equal to 4.5 μm to less than or equal to 24 μm, such as greater than or equal to 5 μm to less than or equal to 22 μm, greater than or equal to 5.5 μm to less than or equal to 20 μm, greater than or equal to 6 μm to less than or equal to 18 μm, greater than or equal to 6.5 μm to less than or equal to 16 μm, greater than or equal to 7 μm to less than or equal to 14 μm, greater than or equal to 7.5 μm to less than or equal to 12 μm, greater than or equal to 8 μm to less than or equal to 10 μm, greater than or equal to 8.5 μm to less than or equal to 10.5 μm, greater than or equal to 9 μm to less than or equal to 11 μm, greater than or equal to 7 μm to less than or equal to 10 μm, and any and all subranges formed between these endpoints. The desired $DOL_{sp}$ may be the same across various thicknesses of the glass-based articles. The relatively high $DOL_{sp}$ contributes to the high fracture resistance of the glass-based articles.

In one or more embodiments, the glass-based articles herein comprise a ratio of $DOC/DOL_{sp}$ of greater than or equal to 10, such as greater than or equal to 11, such as greater than or equal to 12, such as greater than or equal to 13, such as greater than or equal to 14, such as greater than or equal to 15, or more, and all values and sub-ranges there between; and/or the ratio of $DOC/DOL_{sp}$ is less than or equal to 23, such as less than or equal to 22, less than or equal to 21, less than or equal to 20, less than or equal to 19, less than or equal to 20, less than or equal to 18, less than or equal to 20, less than or equal to 17, or less, and all values and sub-ranges there between. In embodiments, the glass-based articles may have a ratio of $DOC/DOL_{sp}$ of greater than or equal to 8 to less than or equal to 23, such as greater than or equal to 9 to less than or equal to 22, greater than or equal to 10 to less than or equal to 21, greater than or equal to 11 to less than or equal to 20, greater than or equal to 12 to less than or equal to 19, greater than or equal to 13 to less than or equal to 18, greater than or equal to 14 to less than or equal to 17, greater than or equal to 15 to less than or equal to 16, and any and all subranges formed from any of these endpoints. In cases where the value of the ratio of $DOC/DOL_{sp}$ is too small, such as below the aforementioned ranges, the glass-based articles may exhibit insufficient fracture resistance, due at least in part to the relatively shallow extent of the "deep" portion of the stress profile extending between the spike and the DOC.

The glass-based articles may include $Li_2O$. In one or more embodiments, the glass-based articles herein comprise a $Li_2O$ concentration at the center of the glass-based-based article of less than or equal to 12 mol %. For example, the $Li_2O$ concentration at the center of the glass-based-based article is less than or equal to 11 mol %, less than or equal to 10 mol %, less than or equal to 9.5 mol %, less than or equal to 9 mol %, less than or equal to 8.5 mol %, less than or equal to 8 mol %, or less, and all values and sub-ranges therebetween. In embodiments, the center of the glass-based articles has a $Li_2O$ concentration of greater than or equal to 0.1 mol % to less than or equal to 12 mol %, such as greater than or equal to 0.5 mol % to less than or equal to 11 mol %, greater than or equal to 1 mol % to less than or equal to 10 mol %, greater than or equal to 2 mol % to less than or equal to 9 mol %, greater than or equal to 3 mol % to less than or equal to 8 mol %, greater than or equal to 4 mol % to less than or equal to 7 mol %, greater than or equal to 5 mol % to less than or equal to 6 mol %, and any and all subranges formed from any of these endpoints. In embodiments, the $Li_2O$ concentration at the center of the glass-based article may be the same as the $Li_2O$ concentration of the glass-based substrate utilized to form the glass-based article. The inclusion of $Li_2O$ in the glass-based substrates utilized to form the glass-based articles, and thereby the center of the glass-based articles, allows for the exchange into the glass-based articles of both potassium and sodium ions, at least in part enabling the achievement of the stress profiles described herein.

In one or more embodiments, the glass-based articles herein comprise a lithium oxide ($Li_2O$) to sodium oxide ($Na_2O$) molar ratio ($Li_2O/Na_2O$) at the center of the glass-based article is in the range of from greater than or equal to 0.3 to less than or equal to 1.1, such as greater than or equal to 0.4 to less than or equal to 1.0, greater than or equal to 0.5 to less than or equal to 0.9, greater than or equal to 0.6 to less than or equal to 0.8, 0.7, and all values and sub-ranges therebetween. In embodiments, the center of the glass-based articles has a $Li_2O/Na_2O$ molar ratio of less than or equal to 1.0. In embodiments, the $Li_2O/Na_2O$ molar ratio at the center of the glass-based article may be the same as the $Li_2O/Na_2O$ molar ratio of the glass-based substrate utilized to form the glass-based article.

In one or more embodiments, the glass-based articles herein comprise a stress slope of the spike that is greater than or equal to 40 MPa/μm, such as greater than or equal to 45 MPa/μm, greater than or equal to 50 MPa/μm, greater than or equal to 55 MPa/μm, greater than or equal to 60 MPa/μm, greater than or equal to 65 MPa/μm, greater than or equal to 70 MPa/μm, greater than or equal to 75 MPa/μm, greater than or equal to 80 MPa/μm, greater than or equal to 85 MPa/μm, greater than or equal to 90 MPa/μm, greater than or equal to 95 MPa/μm, greater than or equal to 100 MPa/μm, greater than or equal to 105 MPa/μm, greater than or equal to 110 MPa/μm, greater than or equal to 115 MPa/μm, greater than or equal to 120 MPa/μm, greater than or equal to 125 MPa/μm, greater than or equal to 130 MPa/μm, greater than or equal to 135 MPa/μm, or more. In embodiments, the stress slope of the spike is less than or equal to 140 MPa/μm, such as less than or equal to 135 MPa/μm, less than or equal to 130 MPa/μm, less than or equal to 125 MPa/μm, less than or equal to 120 MPa/μm, less than or equal to 115 MPa/μm, less than or equal to 110 MPa/μm, less than or equal to 105 MPa/μm, less than or equal to 100 MPa/μm, less than or equal to 95 MPa/μm, less than or equal to 90 MPa/μm, less than or equal to 85 MPa/μm, less than or equal to 80 MPa/μm, less than or equal to 75 MPa/μm, or less. In embodiments, the stress slope of the spike is greater than or equal to 70 MPa/μm to less than or equal to 140 MPa/μm, such as greater than or equal to 75 MPa/μm to less than or equal to 135 MPa/μm, greater than or equal to 80 MPa/μm to less than or equal to 130 MPa/μm, greater than or equal to 85 MPa/μm to less than or equal to 125 MPa/μm, greater than or equal to 90 MPa/μm to less than or equal to 120 MPa/μm, greater than or equal to 95 MPa/μm to less than or equal to 115 MPa/μm, greater than or equal to 100 MPa/μm to less than or equal to 110 MPa/μm, 105 MPa/μm, or any and all subranges formed from any of these endpoints. The stress slope of the spike as described herein refers to the absolute value of the stress slope, the absolute value is utilized to avoid any confusion due to the varying conventions regarding the sign that denotes compressive stress. The stress slope of the spike may be approximated by assuming that the maximum CS occurs at the surface of the glass-based articles and calculating the slope of a line extending from the $CS_{max}$ at the surface to the $CS_k$ at the $DOL_{sp}$. Alternatively, the stress slope of the spike may be determined by fitting a first order polynomial to the measured stress profile in the spike region, and calculating the slope of the polynomial. The stress slope of the spike region is produced at least in part due to the single ion exchange process utilized to form the glass-based articles described herein.

In one or more embodiments, the glass-based articles herein comprise a potassium (K) concentration profile that is substantially linear from a maximum K concentration to a concentration of K of less than or equal to 50% of the maximum K concentration. For example, the potassium (K) concentration profile is substantially linear from the maximum K concentration to a concentration of K of less than or equal to 20% of the maximum concentration, less than or equal to 10% of the maximum concentration, less than or equal to 5% of the maximum concentration, or less, and all values and sub-ranges therebetween. For example, a second derivative of the K concentration profile over a first derivative of the K concentration profile is less than or equal a value over a region extending from the first surface to a depth where a K concentration is equal to the sum of: the K concentration at the center of the glass-based article, and 20% of the difference between the peak K concentration and the K concentration at the center of the glass-based article, wherein the value is 0.5, 0.4, or 0.3 of what is typical for an erfc function at the location where the erfc function decreases to 20% of its peak value.

In one or more embodiments, the glass-based articles herein comprise a potassium (K) concentration profile that is substantially linear from the $CS_{max}$ to a stress of less than or equal to 50% of the $CS_{max}$. For example, the potassium (K) concentration profile is substantially linear from the $CS_{max}$ to a stress of less than or equal to 20% of the $CS_{max}$, less than or equal to 10% of the $CS_{max}$, less than or equal to 5% of the $CS_{max}$, or less, and all values and sub-ranges therebetween.

In one or more embodiments, the glass-based articles herein comprise a merit index (MI) defined by $CS*DOL*CS_k*DOC/PT^{0.5}$, wherein the MI is in the range of greater than or equal to $3 \times 10^6$ MPa²μm²/MPa$^{0.5}$ to less than or equal to $30 \times 10^6$ MPa²μm²/MPa$^{0.5}$, such as greater than or equal to $4 \times 10^6$ MPa²μm²/MPa$^{0.5}$ to less than or equal to $28 \times 10^6$ MPa²μm²/MPa$^{0.5}$, greater than or equal to $5 \times 10^6$ MPa²μm²/MPa$^{0.5}$ to less than or equal to $26 \times 10^6$ MPa²μm²/MPa$^{0.5}$, greater than or equal to $6 \times 10^6$ MPa²μm²/MPa$^{0.5}$ to less than or equal to $24 \times 10^6$ MPa²μm²/MPa$^{0.5}$, greater than or equal to $7 \times 10^6$ MPa²μm²/MPa$^{0.5}$ to less than or equal to $22 \times 10^6$ MPa²μm²/MPa$^{0.5}$, greater than or equal to $8 \times 10^6$ MPa²μm²/MPa$^{0.5}$ to less than or equal to $20 \times 10^6$ MPa²μm²/MPa$^{0.5}$, greater than or equal to $9 \times 10^6$ MPa²μm²/MPa$^{0.5}$ to less than or equal to $19 \times 10^6$ MPa²μm²/MPa$^{0.5}$, greater than or equal to $10 \times 10^6$ MPa²μm²/MPa$^{0.5}$ to less than or equal to $18 \times 10^6$ MPa²μm²/MPa$^{0.5}$, greater than or equal to $11 \times 10^6$ MPa²μm²/MPa$^{0.5}$ to less than or equal to $17 \times 10^6$ MPa²μm²/MPa$^{0.5}$, greater than or equal to $12 \times 10^6$ MPa²μm²/MPa$^{0.5}$ to less than or equal to $16 \times 10^6$ MPa²μm²/MPa$^{0.5}$, greater than or equal to $13 \times 10^6$ MPa²μm²/MPa$^{0.5}$ to less than or equal to $15 \times 10^6$ MPa²μm²/MPa$^{0.5}$, greater than or equal to $14 \times 10^6$ MPa²μm²/MPa$^{0.5}$, and all values and sub-ranges therebetween or formed from any of these endpoints. Glass-based articles with a MI within the aforementioned ranges exhibit improved fracture resistance.

In one or more embodiments, the glass-based articles herein comprise a damage resistant force (DRF) ratio defined by $CS*DOL/CS_k*DOC$, wherein the DRF is in the range of greater than or equal to 0.1 to less than or equal to 5, such as greater than or equal to 0.2 to less than or equal to 4.5, greater than or equal to 0.3 to less than or equal to 4, greater than or equal to 0.4 to less than or equal to 3.5, greater than or equal to 0.5 to less than or equal to 3, greater than or equal to 0.6 to less than or equal to 2.5, greater than or equal to 0.7 to less than or equal to 2, greater than or equal to 0.8 to less than or equal to 1.9, greater than or equal to 0.9 to less than or equal to 1.8, greater than or equal to 1.0 to less than or equal to 1.7, greater than or equal to 1.1 to less than or equal to 1.6, greater than or equal to 1.2 to less than or equal to 1.5, greater than or equal to 1.3 to less than or equal to 1.4, and all values and sub-ranges therebetween or formed from any of these endpoints. Glass-based articles with a DRF ratio within the aforementioned ranges exhibit improved resistance to damage, such as occurs when dropped.

In combination with a maximum compressive stress ($CS_{max}$) of greater than or equal to 700 MPa, such as greater than or equal to 750 MPa, greater than or equal to 800 MPa, greater than or equal to 820 MPa, greater than or equal to 850 MPa, greater than or equal to 900 MPa, or more, and all values and sub-ranges therebetween, the glass-based articles may possess one or a combination of the following features:

a peak tension (PT) of less than or equal to 61 MPa, less than or equal to 60 MPa, less than or equal to 55 MPa, less than or equal to 50 MPa, less than or equal to 45 MPa, less than or equal to 40 MPa, less than or equal to 35 MPa, less than or equal to 30 MPa, including all values and subranges therebetween, or less, and all values and sub-ranges therebetween;

a compressive stress at a knee ($CS_k$) of greater than or equal to 40 MPa, such as greater than or equal to 50 MPa, greater than or equal to 60 MPa, or more, and all values and sub-ranges therebetween; and/or less than or equal to 140

MPa, such as less than or equal to 130 MPa, less than or equal to 120 MPa, or less, and all values and sub-ranges therebetween;

a depth of compression (DOC) that is greater than or equal to 10% of the article's thickness (t), such as greater than or equal to 11% of t, such as greater than or equal to 12% of t, greater than or equal to 13% of t, greater than or equal to 14% of t, or more, and all values and sub-ranges therebetween; and/or a DOC of less than or equal to 18% of t, such as less than or equal to 17% of t, or less, and all values and sub-ranges therebetween;

a DOC that is greater than or equal to 5 micrometers, such as greater than or equal to 10 micrometers, greater than or equal to 20 micrometers, greater than or equal to 30 micrometers, greater than or equal to 40 micrometers, greater than or equal to 50 micrometers, greater than or equal to 60 micrometers, greater than or equal to 70 micrometers, or more, and all values and sub-ranges therebetween; and/or a DOC that is less than or equal to 85 micrometers, less than or equal to 80 micrometers, or less, and all values and sub-ranges therebetween;

a thickness (t) in the range of 0.1 mm to 10 mm, 0.2 mm to 9 mm, 0.3 mm to 8 mm, 0.4 mm to 7 mm, 0.5 mm to 6 mm, 0.6 mm to 5 mm, 0.7 mm to 4 mm, 0.8 mm to 3 mm, 0.9 mm to 2 mm, and 1 mm to 1.9 mm, and all values and sub-ranges therebetween; in an embodiment, t is greater than or equal to 0.35 mm and less than or equal to 1 mm;

a depth of layer of a spike ($DOL_{sp}$) that is greater than or equal to 0.5% of the article's thickness (t), such as greater than or equal to 0.8% of t, greater than or equal to 0.9% of t, greater than or equal to 1% of t, greater than or equal to 1.1% of t, greater than or equal to 1.2% of t, or more, and all values and sub-ranges therebetween; and/or a $DOL_{sp}$ of less than or equal to 4.8% of t, such as less than or equal to 3.5% of t, or less, and all values and sub-ranges therebetween;

a $DOL_{sp}$ that is greater than or equal to 4.5 micrometers, such as greater than or equal to 5 micrometers, greater than or equal to 5.6 micrometers, greater than or equal to 6 micrometers, greater than or equal to 6.5 micrometers, greater than or equal to 7 micrometers, greater than or equal to 7.5 micrometers, greater than or equal to 8 micrometers, greater than or equal to 8.5 micrometers, greater than or equal to 9 micrometers, or more, and all values and sub-ranges therebetween; and/or a $DOL_{sp}$ that is less than or equal to 24 micrometers, less than or equal to 22 micrometers, less than or equal to 20 micrometers, less than or equal to 18 micrometers, less than or equal to 16 micrometers, less than or equal to 14 micrometers, less than or equal to 12 micrometers, less than or equal to 10 micrometers, or less, and all values and sub-ranges therebetween;

a ratio of $DOC/DOL_{sp}$ of greater than or equal to 10, such as greater than or equal to 11, such as greater than or equal to 12, such as greater than or equal to 13, such as greater than or equal to 14, such as greater than or equal to 15, or more, and all values and sub-ranges there between; and/or the ratio of $DOC/DOL_{sp}$ is less than or equal to 23, such as less than or equal to 22, less than or equal to 21, less than or equal to 20, less than or equal to 19, less than or equal to 20, less than or equal to 18, less than or equal to 20, less than or equal to 17, or less, and all values and sub-ranges there between;

a $Li_2O$ concentration at the center of the glass-based-based article of less than or equal to 12 mol %. For example, the $Li_2O$ concentration at the center of the glass-based-based article is less than or equal to 11 mol %, less than or equal to 10 mol %, less than or equal to 9.5 mol %, less than or equal to 9 mol %, less than or equal to 8.5 mol %, less than or equal to 8 mol %, or less, and all values and sub-ranges therebetween;

a lithium oxide ($Li_2O$) to sodium oxide ($Na_2O$) molar ratio ($Li_2O/Na_2O$) at the center of the glass-based article is in the range of from 0.3 to 1.1, and all values and sub-ranges therebetween;

a stress slope of the spike that is greater than or equal to 40 MPa/micrometer;

a potassium (K) concentration profile in the that is substantially linear from a maximum K concentration to a point where a K concentration is less than or equal to 50% of the maximum K concentration; for example, the potassium (K) concentration profile is substantially linear from the maximum K concentration to a point with a K concentration of less than or equal to 20% of the maximum concentration, less than or equal to 10% of the maximum concentration, less than or equal to 5% of the maximum concentration, or less, and all values and sub-ranges therebetween;

a potassium (K) concentration profile that is substantially linear from the $CS_{max}$ to a stress of less than or equal to 50% of the $CS_{max}$, for example, the potassium (K) concentration profile is substantially linear from the $CS_{max}$ to a stress of less than or equal to 20% of the $CS_{max}$, less than or equal to 10% of the $CS_{max}$, less than or equal to 5% of the the $CS_{max}$, or less, and all values and sub-ranges therebetween;

the stress profile does not contain a region of negative second derivative of CS(t) at a depth of greater than or equal to $DOL_{sp}$ and less than or equal to DOC;

a merit index (MI) defined by $CS*DOL*CS_k*DOC/PT^{0.5}$ with a value as described herein; and a damage resistant force (DRF) ratio defined by $CS*DOL/CS_k*DOC$ with a value as described herein.

In an embodiment, a glass-based article comprises: a glass-based substrate comprising opposing first and second surfaces defining a substrate thickness (t); and a stress profile comprising: a peak compressive stress (CS) greater than or equal to 700 MPa; a peak tension (PT) less than or equal to 61 MPa; a depth of compression (DOC) that is greater than or equal to 0.1 t; a depth of layer of a spike ($DOL_{sp}$) that is greater than or equal to 4.5 micrometers; and a stress slope of the spike that is greater than or equal to 40 MPa/micrometer.

A glass-based article comprising: a glass-based substrate comprising opposing first and second surfaces defining a substrate thickness (t); a central composition at the center of the glass-based article comprising lithium; a potassium (K) concentration profile that is substantially linear from a maximum K concentration to a concentration of K that is less than or equal to 50% of the maximum K concentration; and a stress profile comprising: a depth of layer of the spike ($DOL_{sp}$) that is greater than or equal to 0.005 t.

Glass-Based Substrates

Examples of glasses that may be used as substrates may include alkali-aluminosilicate glass compositions or alkali-containing aluminoborosilicate glass compositions, though other glass compositions are contemplated. Specific examples of glass-based substrates that may be used include but are not limited to an alkali-aluminosilicate glass, an alkali-containing borosilicate glass, an alkali-alumino borosilicate glass, an alkali-containing lithium alumino silicate glass, or an alkali-containing phosphate glass. The glass-based substrates have base compositions that may be characterized as ion exchangeable. As used herein, "ion exchangeable" means that a substrate comprising the composition is capable of exchanging cations located at or near the surface of the substrate with cations of the same valence that are either larger or smaller in size.

In one or more embodiments, the glass-based substrates may include a lithium-containing aluminosilicate. In embodiments, the glass-based substrates may be formed from any composition capable of forming the stress profiles. For example, the glass-based substrates may be formed from the lithium aluminosilicate compositions described in U.S. Patent App. Pub. No. 2016/0376186 A1 titled "Glass with High Surface Strength, published Dec. 29, 2016, the entirety of which is incorporated herein by reference.

In some embodiments, the glass-based substrates may be formed from the glass compositions described in U.S. Patent App. Pub. No. 2019/0161390 A1 titled "Glasses with Low Excess Modifier Content," and published May 30, 2019 (claiming priority from U.S. Provisional Application No. 62/591,953 titled "Glasses with Low Excess Modifier Content," filed Nov. 29, 2017), the entirety of which is incorporated herein by reference. In some embodiments, the glass articles may be formed from the glass compositions described in U.S. Patent App. Pub. No. 2019/0161386 A1 titled "Ion-Exchangeable Mixed Alkali Aluminosilicate Glasses," and published May 30, 2019 (claiming priority from U.S. Provisional Application No. 62/591,958 titled "Ion-Exchangeable Mixed Alkali Aluminosilicate Glasses," filed Nov. 29, 2017), the entirety of which is incorporated herein by reference.

In embodiments, the glass-based substrates include $SiO_2$ in an amount greater than or equal to 58 mol %. In one or more embodiments, the glass-based substrate comprises $SiO_2$ in an amount greater than or equal to 58 mol % to less than or equal to 65 mol %, from greater than or equal to 59 mol % to less than or equal to 65 mol %, from greater than or equal to 60 mol % to less than or equal to 65 mol %, from greater than or equal to 61 mol % to less than or equal to 65 mol %, from greater than or equal to 62 mol % to less than or equal to 65 mol %, from greater than or equal to 63 mol % to less than or equal to 65 mol %, from greater than or equal to 58 mol % to less than or equal to 64 mol %, from greater than or equal to 58 mol % to less than or equal to 63 mol %, from greater than or equal to 58 mol % to less than or equal to 62 mol %, from greater than or equal to 58 mol % to less than or equal to 61 mol %, from greater than or equal to 58 mol % to less than or equal to 60 mol %, from greater than or equal to 63 mol % to less than or equal to 65 mol %, from greater than or equal to 63.2 mol % to less than or equal to 65 mol %, from greater than or equal to 63.3 mol % to less than or equal to 65 mol %, and any and all subranges formed from any of these endpoints. $SiO_2$ is the primary glass forming oxide in the glass-based substrates and forms the network backbone for the molten glass.

In embodiments, the glass-based substrates include $Al_2O_3$ in an amount greater than or equal to 11 mol %. In one or more embodiments, the glass-based substrates include $Al_2O_3$ in an amount greater than or equal to 11 mol % to less than or equal to 20 mol %, from greater than or equal to 12 mol % to less than or equal to 20 mol %, from greater than or equal to 13 mol % to less than or equal to 20 mol %, from greater than or equal to 14 mol % to less than or equal to 20 mol %, from greater than or equal to 15 mol % to less than or equal to 20 mol %, from greater than or equal to 11 mol % to less than or equal to 19 mol %, from greater than or equal to 11 mol % to less than or equal to 18.5 mol %, from greater than or equal to 11 mol % to less than or equal to 18 mol %, from greater than or equal to 11 mol % to less than or equal to 17.5 mol %, from greater than or equal to 11 mol % to less than or equal to 17 mol %, from greater than or equal to 11 mol % to less than or equal to 16.5 mol %, from greater than or equal to 11 mol % to less than or equal to 16 mol %, from greater than or equal to 14 mol % to less than or equal to 17 mol %, from greater than or equal to 15 mol % to less than or equal to 17 mol %, from greater than or equal to 15 mol % to less than or equal to 16 mol %, and any and all subranges formed from any of these endpoints. Like $SiO_2$, $Al_2O_3$ is a network former and contributes to the rigidity to the glass network in the glass-based substrates.

In embodiments, the glass-based substrates include $P_2O_5$. In one or more embodiments, the glass-based substrates include $P_2O_5$ in an amount greater than or equal to 0.5 mol % to less than or equal to 5 mol %, such as from greater than or equal to 0.6 mol % to less than or equal to 5 mol %, from greater than or equal to 0.8 mol % to less than or equal to 5 mol %, from greater than or equal to 1 mol % to less than or equal to 5 mol %, from greater than or equal to 1.2 mol % to less than or equal to 5 mol %, from greater than or equal to 1.4 mol % to less than or equal to 5 mol %, from greater than or equal to 1.5 mol % to less than or equal to 5 mol %, from greater than or equal to 1.6 mol % to less than or equal to 5 mol %, from greater than or equal to 1.8 mol % to less than or equal to 5 mol %, from greater than or equal to 2 mol % to less than or equal to 5 mol %, from greater than or equal to 0.5 mol % to less than or equal to 3 mol %, from greater than or equal to 0.6 mol % to less than or equal to 3 mol %, from greater than or equal to 0.8 mol % to less than or equal to 3 mol %, from greater than or equal to 1 mol % to less than or equal to 3 mol %, from greater than or equal to 1.2 mol % to less than or equal to 3 mol %, from greater than or equal to 1.4 mol % to less than or equal to 3 mol %, from greater than or equal to 1.5 mol % to less than or equal to 3 mol %, from greater than or equal to 1.6 mol % to less than or equal to 3 mol %, from greater than or equal to 1.8 mol % to less than or equal to 3 mol %, from greater than or equal to 2 mol % to less than or equal to 3 mol %, from greater than or equal to 0.5 mol % to less than or equal to 2.8 mol %, from greater than or equal to 0.5 mol % to less than or equal to 2.6 mol %, from greater than or equal to 0.5 mol % to less than or equal to 2.5 mol %, from greater than or equal to 0.5 mol % to less than or equal to 2.4 mol %, from greater than or equal to 0.5 mol % to less than or equal to 2.2 mol %, from greater than or equal to 0.5 mol % to less than or equal to 2 mol %, from greater than or equal to 2.5 mol % to less than or equal to 5 mol %, from greater than or equal to 2.5 mol % to less than or equal to 4 mol %, from greater than or equal to 2.5 mol % to less than or equal to 3 mol %, and any and all subranges formed from any of these endpoints. Incorporating $P_2O_5$ in the glass-based substrates increases the ion-exchange interdiffusion rate, which may decrease the necessary IOX time, and improves glass compatibility with zircon refractory materials.

In embodiments, the glass-based substrates may be substantially free or free of $B_2O_3$. The presence of $B_2O_3$ in the glass-based substrate may have a negative impact on compressive stress when the glass-based substrate is strengthened by ion exchange.

In embodiments, the glass-based substrates include $Na_2O$. In embodiments, the glass-based substrates include $Na_2O$ in an amount greater than or equal to 4 mol % to less than or equal to 20 mol % $Na_2O$, such as from greater than or equal to 4.5 mol % to less than or equal to 20 mol %, from greater than or equal to 5 mol % to less than or equal to 20 mol %, from greater than or equal to 5.5 mol % to less than or equal to 20 mol %, from greater than or equal to 6 mol % to less than or equal to 20 mol %, from greater than or equal to 6.5 mol % to less than or equal to 20 mol %, from greater than or equal to 7 mol % to less than or equal to 20 mol %, from greater than or equal to 7.5 mol % to less than or equal to 20 mol %, from greater than or equal to 8 mol % to less than or equal to 20 mol %, from greater than or equal to 8.5 mol % to less than or equal to 20 mol %, from greater than or equal to 9 mol % to less than or equal to 20 mol %, from greater than or equal to 9.5 mol % to less than or equal to 20 mol %, from greater than or equal to 10 mol % to less than or equal to 20 mol %, from greater than or equal to 4 mol % to less than or equal to 19.5 mol %, from greater than or equal to 4 mol % to less than or equal to 19 mol %, from greater than or equal to 4 mol % to less than or equal to 18.5 mol %, from greater than or equal to 4 mol % to less than or equal to 18 mol %, from greater than or equal to 4 mol % to less than or equal to 17.5 mol %, from greater than or equal to 4 mol % to less than or equal to 17 mol %, from greater than or equal to 4 mol % to less than or equal to 16.5 mol %, from greater than or equal to 4 mol % to less than or equal to 16 mol %, from greater than or equal to 4 mol % to less than or equal to 15.5 mol %, from greater than or equal to 4 mol % to less than or equal to 15 mol %, from greater than or equal to 4 mol % to less than or equal to 14.5 mol %, from greater than or equal to 4 mol % to less than or equal to 14 mol %, from greater than or equal to 6 mol % to less than or equal to 18 mol %, from greater than or equal to 7 mol % to less than or equal to 18 mol %, from greater than or equal to 8 mol % to less than or equal to 18 mol %, from greater than or equal to 9 mol % to less than or equal to 18 mol %, from greater than or equal to 6 mol % to less than or equal to 12 mol %, from greater than or equal to 6 mol % to less than or equal to 11 mol %, from greater than or equal to 6 mol % to less than or equal to 10 mol %, and any and all subranges formed from any of these endpoints. The alkali oxide $Na_2O$ is used to achieve chemical strengthening of the alkali aluminosilicate glass-based substrates described herein by ion exchange.

In embodiments, the glass-based substrates include $Li_2O$. In embodiments, the glass-based substrates include $Li_2O$ in amount from greater than or equal to 0 mol % to less than or equal to 13 mol %, such as from greater than 0 mol % to less than or equal to 9.5 mol %, from greater than or equal to 0 mol % to less than or equal to 9 mol %, from greater than or equal to 0 mol % to less than or equal to 8.5 mol %, from greater than or equal to 0 mol % to less than or equal to 8 mol %, from greater than or equal to 0 mol % to less than or equal to 7.5 mol %, from greater than or equal to 0 mol % to less than or equal to 7 mol %, from greater than or equal to 0.1 mol % to less than or equal to 10 mol %, from greater than or equal to 0.1 mol % to less than or equal to 9.5 mol %, from greater than or equal to 0.1 mol % to less than or equal to 9 mol %, from greater than or equal to 0.1 mol % to less than or equal to 8.5 mol %, from greater than or equal to 0.1 mol % to less than or equal to 8 mol %, from greater than or equal to 0.1 mol % to less than or equal to 7.5 mol %, from greater than or equal to 0.1 mol % to less than or equal to 7 mol %, from greater than or equal to 4 mol % to less than or equal to 8 mol %, and any and all subranges formed from any of these endpoints. The presence of $Li_2O$ in the glass-based substrates allows for the exchange of both potassium and sodium ions into the glass-based substrate during ion exchange, enabling the stress profiles described herein.

In embodiments, the glass-based substrates have an $R_2O/Al_2O_3$ molar ratio of less than 2, where $R_2O$ is the total alkali metal oxide content of the glass-based substrate. In embodiments, the glass-based substrates have an $R_2O/Al_2O_3$ molar ratio of greater than or equal to 0.9 to less than or equal to 1.6.

The glass-based substrates may be characterized by the manner in which it may be formed. For instance, the glass-based substrates may be characterized as float-formable (i.e., formed by a float process), down-drawable and, in particular, fusion-formable or slot-drawable (i.e., formed by a down draw process such as a fusion draw process or a slot draw process).

Some embodiments of the glass-based substrates described herein may be formed by a down-draw process. Down-draw processes produce glass-based substrates having a uniform thickness that possess relatively pristine surfaces. Because the average flexural strength of the glass-based article is controlled by the amount and size of surface flaws, a pristine surface that has had minimal contact has a higher initial strength. In addition, down drawn glass-based articles have a very flat, smooth surface that can be used in its final application without costly grinding and polishing.

Some embodiments of the glass-based substrates may be described as fusion-formable (i.e., formable using a fusion draw process). The fusion process uses a drawing tank that has a channel for accepting molten glass raw material. The channel has weirs that are open at the top along the length of the channel on both sides of the channel. When the channel fills with molten material, the molten glass overflows the weirs. Due to gravity, the molten glass flows down the outside surfaces of the drawing tank as two flowing glass films.

These outside surfaces of the drawing tank extend down and inwardly so that they join at an edge below the drawing tank. The two flowing glass films join at this edge to fuse and form a single flowing glass article. The fusion draw method offers the advantage that, because the two glass films flowing over the channel fuse together, neither of the outside surfaces of the resulting glass article comes in contact with any part of the apparatus. Thus, the surface properties of the fusion drawn glass article are not affected by such contact.

Some embodiments of the glass-based substrates described herein may be formed by a slot draw process. The slot draw process is distinct from the fusion draw method. In slot draw processes, the molten raw material glass is provided to a drawing tank. The bottom of the drawing tank has an open slot with a nozzle that extends the length of the slot. The molten glass flows through the slot/nozzle and is drawn downward as a continuous glass article and into an annealing region.

In one or more embodiments, the glass-based substrates described herein may exhibit an amorphous microstructure and may be substantially free of crystals or crystallites. In other words, the glass-based substrates articles exclude glass-ceramic materials in some embodiments.

Ion Exchange (IOX) Treatment

Chemical strengthening of glass-based substrates having base compositions is done by placing the ion-exchangeable glass-based substrates in a molten bath containing cations (e.g., $K^+$, $Na^+$, $Ag^+$, etc) that diffuse into the glass while the smaller alkali ions (e.g., $Na^+$, $Li^+$) of the glass diffuse out into the molten bath. The replacement of the smaller cations by larger ones creates compressive stresses near the top surface of glass. Tensile stresses are generated in the interior of the glass to balance the near-surface compressive stresses.

In addition to alkali metal salts, molten baths may further comprise one or more additives. Additives are added based on the total weight of the alkali metal salts in the molten bath, referred to as the total molten bath weight. Additives may adjust pH of the molten baths. Additives may assist in scavenging ions that may interfere with diffusion of alkali metals into the substrates. For example, some additives may scavenge divalent ions. An exemplary additive that can scavenge divalent ions is silicic acid. An amount of silicic acid may be in the range of 0.1 to 1% by weight of the total molten bath weight, such as 0.5% by weight of the total molten bath weight. In addition, some additives may also scavenge poisoning ions such as $Li^+$. An exemplary additive that can scavenge divalent ions and $Li^+$ is tri-sodium phosphate (TSP). An amount of TSP may be in the range of 0.1 to 1% by weight of the total molten bath weight.

With respect to ion exchange processes, they may independently be a thermal-diffusion process or an electro-diffusion process. By way of illustration, a general description of ion exchange processes in which glass is immersed in multiple ion exchange baths, with washing and/or annealing steps between immersions, are described in U.S. Pat. No. 8,561,429, by Douglas C. Allan et al., issued on Oct. 22, 2013, entitled "Glass with Compressive Surface for Consumer Applications," and claiming priority from U.S. Provisional Patent Application No. 61/079,995, filed Jul. 11, 2008, in which glass is strengthened by immersion in multiple, successive, ion exchange treatments in salt baths of different concentrations; and U.S. Pat. No. 8,312,739, by Christopher M. Lee et al., issued on Nov. 20, 2012, and entitled "Dual Stage Ion Exchange for Chemical Strengthening of Glass," and claiming priority from U.S. Provisional Patent Application No. 61/084,398, filed Jul. 29, 2008, in which glass is strengthened by ion exchange in a first bath is diluted with an effluent ion, followed by immersion in a second bath having a smaller concentration of the effluent ion than the first bath. The contents of U.S. Pat. Nos. 8,561,429 and 8,312,739 are incorporated herein by reference in their entireties.

After an ion exchange process is performed, it should be understood that a composition at the surface of a glass article may be different than the composition of the as-formed glass article (i.e., the glass article before it undergoes an ion exchange process). This results from one type of alkali metal ion in the as-formed glass, such as, for example $Li^+$ or $Na^+$, being replaced with larger alkali metal ions, such as, for example $Na^+$ or $K^+$, respectively. However, the glass composition at or near the center of the depth of the glass article will, in embodiments, still have the composition of the as-formed glass article.

In one more embodiments, methods herein are conducted by a single ion exchange (SIOX) treatment. As utilized herein, a SIOX treatment refers to a process in which the glass-based substrates are contacted with only a single molten salt bath to form the glass-based articles. The employment of a SIOX treatment may reduce cost and simplify production of the glass-based articles when comparted to multiply IOX processes. In one or more embodiments, no further chemical or heat strengthening steps beyond SIOX are conducted. In one or more embodiments, no further ion exchange strengthening steps beyond SIOX are conducted. Methods herein may further comprise polishing the glass-based articles after SIOX.

SIOX treatments may be enhanced by the inclusion of salts that are dissolvable/highly soluble in conventional molten salt IOX baths. For example, in combination with conventional nitrate salts for a desired metal, an additional salt, for example, a carbonate, sulfate, chloride, fluorine, borate, and/or phosphate salt for the same metal is dissolved in the nitrate salt and is present during SIOX. The additional salt remains at or below its solubility limit in the nitrate salt(s). Any poisoning ions remain at or below their solubility limits in the bath mixture. An additional salt may be one or more of: $K_2CO_3$, $Na_2CO_3$, $K_3PO_4$, $Na_3PO_4$, $K_2SO_4$, $Na_2SO_4$, $K_3BO_3$, $Na_3BO_3$, KCl, NaCl, KF, and NaF. The additional salt is added to a conventional molten salt bath (e.g., nitrates such as $KNO_3$ and/or $NaNO_3$) as a dissolved liquid solute so that the ion exchange process is carried out and IOX efficiency can be enhanced.

In embodiments, the molten salt bath may comprise by weight: $KNO_3$ in an amount in the range of greater than 0 to 99.9%; $NaNO_3$ in an amount in the range of 0 to 99.9%; $K_2CO_3$ in an amount in the range of 0.1 to 20%; and $Na_2CO_3$ in an amount in the range of 0 to 20%, and all values and sub-ranges therebetween. For example, the molten salt bath may comprise by weight: $KNO_3$ in an amount in the range of 40 to 99.5%; $NaNO_3$ in an amount in the range of 0 to 60%; $K_2CO_3$ in an amount in the range of 0.5 to 10%; and $Na_2CO_3$ in an amount in the range of 0 to 10%, and all values and sub-ranges therebetween. For example, the molten salt bath comprises by weight: $KNO_3$ in an amount in the range of 40 to 99.5%; $NaNO_3$ in an amount in the range of 0 to 60%; $K_2CO_3$ in an amount in the range of 0.5 to 10%; and $Na_2CO_3$ in an amount in the range of 0 to 10%, and all values and sub-ranges therebetween. In one or more embodiments, the amounts of $KNO_3$, $NaNO_3$, $K_2CO_3$, and $Na_2CO_3$ total 100%.

In embodiments, the molten salt bath may include $KNO_3$ in an amount in the range from greater than 0 wt % to less than or equal to 99.9 wt %, such as greater than or equal to 10 wt % to less than or equal to 99 wt %, greater than or equal to 20 wt % to less than or equal to 90 wt %, greater than or equal to 30 wt % to less than or equal to 85 wt %, greater than or equal to 40 wt % to less than or equal to 80 wt %, greater than or equal to 50 wt % to less than or equal to 75 wt %, greater than or equal to 55 wt % to less than or equal to 70 wt %, greater than or equal to 60 wt % to less than or equal to 65 wt %, and any and all subranges formed from any of these endpoints. In embodiments, the molten salt bath includes $KNO_3$ in an amount of from greater than or equal to 75 wt % to less than or equal to 90 wt %, such as about 83 wt %.

In embodiments, the molten salt bath may include $NaNO_3$ in an amount in the range from greater than 0 wt % to less than or equal to 99.9 wt % such as greater than or equal to 10 wt % to less than or equal to 99 wt %, greater than or equal to 20 wt % to less than or equal to 90 wt %, greater than or equal to 30 wt % to less than or equal to 85 wt %, greater than or equal to 40 wt % to less than or equal to 80 wt %, greater than or equal to 50 wt % to less than or equal to 75 wt %, greater than or equal to 55 wt % to less than or equal to 70 wt %, greater than or equal to 60 wt % to less than or equal to 65 wt %, and any and all subranges formed from any of these endpoints. In embodiments, the molten salt bath includes $NaNO_3$ in an amount of from greater than or equal to 5 wt % to less than or equal to 15 wt %, such as about 9 wt %.

In embodiments, the molten salt bath may include a carbonate, such as $K_2CO_3$ and/or $Na_2CO_3$. In other embodiments, the molten salt bath may be substantially free of carbonate. In embodiments, the molten salt bath may include $K_2CO_3$ in an amount in the range from greater than or equal to 0 wt % to less than or equal to 20 wt %, such as greater than or equal to 0.1 wt % to less than or equal to 15 wt %, greater than or equal to 1 wt % to less than or equal to 10 wt %, greater than or equal to 2 wt % to less than or equal to 9 wt %, greater than or equal to 3 wt % to less than or equal to 8 wt %, greater than or equal to 4 wt % to less than or equal to 7 wt %, greater than or equal to 5 wt % to less than or equal to 6 wt %, %, and any and all subranges formed from any of these endpoints. In embodiments, the molten salt bath may include $Na_2CO_3$ in an amount in the range from greater than or equal to 0 wt % to less than or equal to 20 wt %, such as greater than or equal to 0.1 wt % to less than or equal to 15 wt %, greater than or equal to 1 wt % to less than or equal to 10 wt %, greater than or equal to 2 wt % to less than or equal to 9 wt %, greater than or equal to 3 wt % to less than or equal to 8 wt %, greater than or equal to 4 wt % to less than or equal to 7 wt %, greater than or equal to 5 wt % to less than or equal to 6 wt %, %, and any and all subranges formed from any of these endpoints. In embodiments, the molten salt bath includes $NaNO_3$ in an amount of from greater than or equal to 1 wt % to less than or equal to 10 wt %, such as about 5 wt %.

In embodiments, the molten salt bath may additionally include silicic acid. Silicic acid may be included in the molten salt bath in amounts of up to 1 wt %, such as from greater than or equal to 0 wt % to less than or equal to 1 wt %, greater than or equal to 0.1 wt % to less than or equal to 0.9 wt %, greater than or equal to 0.2 wt % to less than or equal to 0.8 wt %, greater than or equal to 0.3 wt % to less than or equal to 0.7 wt %, greater than or equal to 0.4 wt % to less than or equal to 0.6 wt %, 0.5 wt %, and any and all subranges formed from any of these endpoints.

The IOX conditions, such as the temperature of the molten salt bath and the duration of the contact of the glass-based substrate with the molten salt bath may be any condition that will produce the desired stress profiles. In embodiments, the temperature of the molten salt bath may be from greater than or equal to 350° C. to less than or equal to 430° C., such as greater than or equal to 360° C. to less than or equal to 420° C., greater than or equal to 370° C. to less than or equal to 410° C., greater than or equal to 380° C. to less than or equal to 400° C., 390° C. to less than or equal to 430° C., and any and all subranges formed from any of these endpoints. In embodiments, the IOX treatment may extend for a duration from greater than or equal to 40 minutes to less than or equal to 100 minutes, such as greater than or equal to 45 minutes to less than or equal to 95 minutes, greater than or equal to 50 minutes to less than or equal to 90 minutes, greater than or equal to 55 minutes to less than or equal to 85 minutes, greater than or equal to 60 minutes to less than or equal to 80 minutes, greater than or equal to 65 minutes to less than or equal to 75 minutes, 70 minutes, and any and all subranges formed from any of these endpoints.

End Products

The glass-based articles disclosed herein may be incorporated into another article such as an article with a display (or display articles) (e.g., consumer electronics, including mobile phones, tablets, computers, navigation systems, and the like), architectural articles, transportation articles (e.g., automobiles, trains, aircraft, sea craft, etc.), appliance articles, or any article that requires some transparency, scratch-resistance, abrasion resistance or a combination thereof. An exemplary article incorporating any of the glass-based articles disclosed herein is shown in FIGS. 4A and 4B. Specifically, FIGS. 4A and 4B show a consumer electronic device 200 including a housing 202 having front 204, back 206, and side surfaces 208; electrical components (not shown) that are at least partially inside or entirely within the housing and including at least a controller, a memory, and a display 210 at or adjacent to the front surface of the housing; and a cover substrate 212 at or over the front surface of the housing such that it is over the display. In some embodiments, the cover substrate 212 may include any of the glass-based articles disclosed herein.

EXAMPLES

Embodiments will be further clarified by the following examples. It should be understood that these examples are not limiting to the embodiments described above.

Glass sheets were formed having a lithium-alumino silicate glass composition according to Composition A. Composition A as-formed and analyzed included: 63.60 mol % $SiO_2$, 15.67 mol % $Al_2O_3$, 10.81 mol % $Na_2O$, 6.24 mol % $Li_2O$, 1.16 mol % ZnO, 0.04 mol % $SnO_2$, and 2.48 mol % $P_2O_5$.

Glass sheets for comparison were formed having an alkali aluminosilicate glass composition that is lithium-free according to Composition B. Composition B as-formed and analyzed included: 67.37 mol % $SiO_2$, 3.67 mol % $B_2O_3$, 12.73 mol % $Al_2O_3$, 13.77 mol % $Na_2O$, 0.01 mol % $K_2O$, 2.39 mol % MgO, 0.01 mol % $Fe_2O_3$, 0.01 mol % $ZrO_2$, and 0.09 mol % $SnO_2$.

Comparative Examples A-B

Glass articles were formed from Composition B having thicknesses of 0.5 mm and 0.7 mm that were exposed to a single ion exchange (SIOX) with according to the general conditions described in Table 1 below. An amount of 0.5 wt. % silicic acid was added to each bath based on the total molten bath weight.

TABLE 1

| Example | | Thickness (mm) | $KNO_3$ (wt %) | $NaNO_3$ (wt %) | Temp (° C.) | Time (min) |
|---|---|---|---|---|---|---|
| A Comparative | SIOX 0% Na | 0.5 | ≥99.7 | ≤0.3 | 420 | 330 |
| B Comparative | SIOX 0% Na | 0.7 | ≥99.7 | ≤0.3 | 420 | 330 |

Comparative Examples A and B were analyzed as follows. Percent weight gain was calculated based on the substrate before SIOX and after SIOX. Peak compressive stress ($CS_{max}$) and depth of layer of a spike ($DOL_{sp}$) were measured by FSM. Peak tension (PT) was measured by SCALP. The results are provided in Table 2.

TABLE 2

| Example | Δm/m (%) | $CS_{max}$ (MPa) | $DOL_{sp}$ (μm) | PT (MPa) |
|---|---|---|---|---|
| A Comparative | 0.4213 | 857 | 41.8 | 68.3 |
| B Comparative | 0.2809 | 854 | 43 | 49.4 |

Comparative Examples C-D

Glass articles were formed from Composition A having thicknesses of 0.5 mm and 0.7 mm that were exposed to a single ion exchange (SIOX) with according to the conditions described in Table 3 below. An amount of 0.5 wt. % silicic acid was added to each bath based on the total weight of the bath.

TABLE 3

| Example | | Thickness (mm) | KNO$_3$ (wt %) | NaNO$_3$ (wt %) | Temp (° C.) | Time (min) |
|---|---|---|---|---|---|---|
| C Comparative | SIOX 0% Na | 0.5 | ≥99.7 | ≤0.3 | 420 | 390 |
| D Comparative | SIOX 0% Na | 0.7 | ≥99.7 | ≤0.3 | 420 | 390 |

Comparative Examples C and D were analyzed as follows. Percent weight gain was calculated based on the substrate before SIOX and after SIOX. Peak compressive stress ($CS_{max}$) and depth of layer of a spike ($DOL_{sp}$) were measured by FSM. Peak tension (PT) was measured by SCALP. The results are provided in Table 4. An amount of 0.5 wt. % silicic acid was added to each bath based on the total molten bath weight.

TABLE 4

| Example | Δm/m (%) | $CS_{max}$ (MPa) | $DOL_{sp}$ (μm) | PT (MPa) |
|---|---|---|---|---|
| C Comparative | 0.8033 | 902 | 39.8 | 71.95 |
| D Comparative | 0.5513 | 937 | 38.3 | 50.2 |

Comparative Examples E-H

Effect of dual ion exchange (DIOX) to form glass articles from Composition A and having thicknesses of 0.5 mm and 0.7 mm was modeled according to the conditions described in Table 5 below. An amount of 0.5 wt. % silicic acid was added to each bath based on the total molten bath weight.

TABLE 5

| Example | Thickness (mm) | DIOX | Glass m$^2$/kg salt | KNO$_3$ (wt %) | NaNO$_3$ (wt %) | Temp (° C.) | Time (min) |
|---|---|---|---|---|---|---|---|
| E Comparative | 0.5 | Step 1 | 0 | 62 | 38 | 380 | 80 |
| F Comparative | | Step 2 | 0 | 91.00 | 9.00 | 370 | 18 |
| G Comparative | 0.7 | Step 1 | 0 | 62 | 38 | 380 | 85 |
| H Comparative | | Step 2 | 0 | 91.00 | 9.00 | 370 | 33 |

Comparative Examples E-H were diffusion modeled using a plane strain ion exchange (IOX) model. Table 6 provides modeled stress attributes of Comparative Examples E-H.

TABLE 6

| Example | Δm/m (%) | $CS_k$ (MPa) | $CS_{max}$ (MPa) | PT (MPa) | $DOL_{sp}$ (μm) | DOC (μm) |
|---|---|---|---|---|---|---|
| E Comparative | 0.5202 | 134.2 | 582.5 | 63.3 | 7.7 | 94.0 |
| F Comparative | 0.0442 | 114.0 | 830.1 | 62.6 | 9.0 | 93.0 |
| G Comparative | 0.3830 | 151.1 | 599.8 | 50.4 | 7.9 | 118 |
| H Comparative | 0.0653 | 127.1 | 841 | 54.9 | 10 | 123 |

Examples 1-12

Glass articles were formed from Composition A having thicknesses of 0.5 mm and 0.7 mm that were exposed to a single ion exchange (SIOX) according to the conditions described in Table 7 below. An amount of 0.5 wt. % silicic acid was added to each bath based on the total molten bath weight.

TABLE 7

| Example | | Thickness (mm) | KNO$_3$ (wt %) | NaNO$_3$ (wt %) | Temp (° C.) | Time (min) |
|---|---|---|---|---|---|---|
| 1 | SIOX 6% Na | 0.5 | 94 | 6 | 380 | 56 |
| 2 | | | | | | |
| 3 | | | | | | |
| 4 | SIOX 9% Na | 0.5 | 91 | 9 | 380 | 65 |
| 5 | | | | | | |
| 6 | | | | | | |
| 7 | SIOX 15% Na | 0.5 | 85 | 15 | 380 | 80 |
| 8 | | | | | | |
| 9 | | | | | | |
| 10 | SIOX 6% Na | 0.7 | 94 | 6 | 380 | 60 |
| 11 | SIOX 9% Na | 0.7 | 91 | 9 | 380 | 70 |
| 12 | SIOX 15% Na | 0.7 | 85 | 15 | 380 | 85 |

Examples 1 to 12 were analyzed as follows. Percent weight gain was calculated based on the substrate before SIOX and after SIOX. Peak compressive stress ($CS_{max}$), depth of layer of a spike ($DOL_{sp}$), and peak tension (PT) were measured by FSM. Peak tension (PT) was measured by SCALP. Depth of compression (DOC) was analyzed by RNF. Compressive stress at a knee ($CS_k$) was measured by RNF or FSM as noted. The results are provided in Table 8.

TABLE 8

| Example | Δm/m (%) | $CS_{max}$ (MPa) | $DOL_{sp}$ (μm) | PT (MPa) | DOC (μm) | $CS_k$ (MPa) |
|---|---|---|---|---|---|---|
| 1 | 0.3075 | 862 | 8.2 | 41.8 | — | 63[1] |
| 2 | — | 871 | 8.0 | — | — | 46[2] |
| 3 | 0.3209 | 879 | 7.8 | 43.8 | 80 | 51[1] |
| 4 | 0.3743 | 809 | 8.8 | 49.6 | — | 59[2] |
| 5 | — | 817 | 8.3 | — | — | 83[2] |
| 6 | 0.3841 | 826 | 8.4 | 53.0 | 83.5 | 64[1] |
| 7 | 0.499 | 756 | 9.3 | 60.6 | — | 92[2] |
| 8 | — | 738 | 8.8 | — | — | 91[2] |
| 9 | 0.4746 | 747 | 8.9 | 58.6 | 90 | 87[1] |
| 10 | 0.2444 | 902 | 8.1 | 37.3 | 108 | 74[1] |
| 11 | 0.2957 | 839 | 8.7 | 42.4 | 110 | 83[1] |
| 12 | 0.358 | 768 | 9.0 | 50.9 | 118 | 106[1] |

[1]By RNF
[2]By FSM

Comparative Examples A-B and Examples 5, 8, 11, and 12 were analyzed for drop performance as follows. A controlled drop test including multiple drops of glass-based articles were performed where the glass-based substrates were mounted on a phone-sized puck, and the assemblies were dropped onto a 180 grit sand-paper (to simulate rough surfaces) such that the glass-based articles contacted the sand-paper. Drop tests were performed under ambient conditions (air, room temperature). The first drop was performed at a starting height of 20 cm, which represented the distance from the exposed surface of a cover glass to the top of a drop surface. If no cover glass failure occurred, the drop height was increased by 10 cm, and the puck was dropped again. The puck was sequentially dropped at 10 cm increments (e.g., 10 cm, then 20 cm, then 30 cm, etc.) until the cover glass failed. Table 9 provides the results.

TABLE 9

| Example | Thickness (mm) | $CS_{max}$ (MPa) | $DOL_{sp}$ (μm) | DOC (μm) | Drop Height to Failure (cm) |
|---|---|---|---|---|---|
| A Comparative SIOX 0% Na 330 min | 0.5 | 857 | 42 | — | 28 |
| 5 SIOX 9% Na 65 min | | 817 | 8.3 | 84 | 53 |
| 8 SIOX 15% Na 80 min | | 738 | 8.8 | 90 | 75 |
| B Comparative SIOX 0% Na 330 min | 0.7 | 854 | 43 | — | 49 |
| 11 SIOX 9% Na 70 min | | 839 | 8.7 | 110 | 76 |
| 12 SIOX 15% Na 85 min | | 768 | 9 | 118 | 74 |

The inventive glasses of Examples 5, 8, and 11-12, which have a relatively small $DOL_{sp}$, provide 1.5 to 2 times better drop performance relative to Comparative Examples A and B, which have a deeper $DOL_{sp}$.

Figure 4:
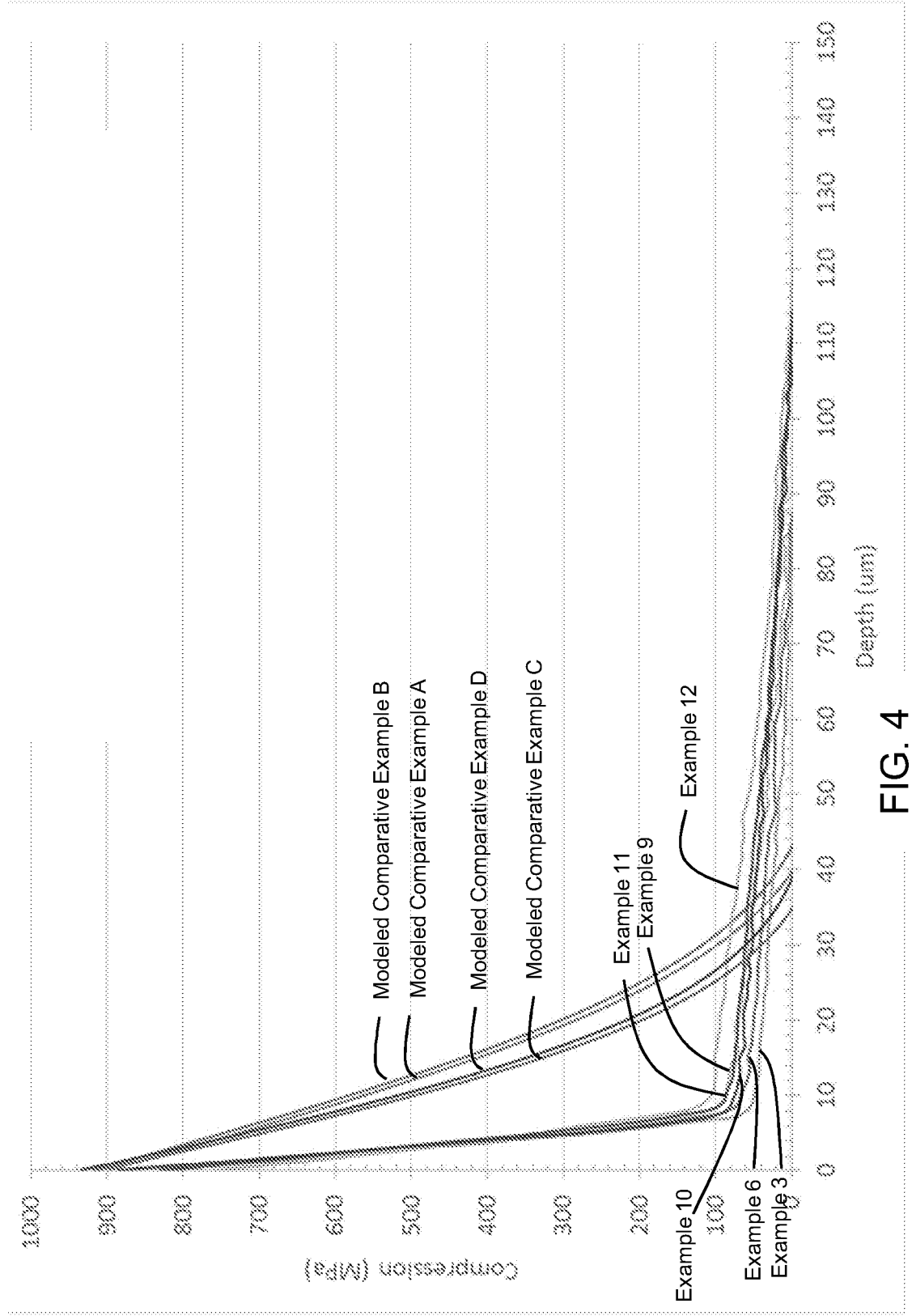
FIG. 4 is a graph of modeled stress profiles for Comparative Examples A and B, and of measured stress profiles for Examples 3, 6, 9, 10, 11, and 12.

FIG. 4 shows a plot of exemplary stress profiles for Comparative Examples A-D and Examples 3, 6, and 9-12. The stress profiles in FIG. 4 are for a first depth (up to of 125 micrometers) of the chemically-strengthened glass articles. For Comparative Examples A-D, the stress profiles were diffusion modeled using a plane strain ion exchange (IOX) model. For Examples 3, 6, and 9-12, the stress profiles are based on experimental data.

Examples 13-17

Glass articles were formed from Composition A having a thickness of 0.5 mm that were exposed to a single ion exchange (SIOX) with two alkali metals in the presence of silicic acid according to the following conditions: bath of 9% $NaNO_3$ and 91% $KNO_3$; 0.5 wt. % silicic acid added to the bath based on the total molten bath weight; 380° C.; 65 minutes. Table 10 provides $CS_{max}$, $DOL_{sp}$, and $CS_k$ as measured by FSM (averaged over 4 samples); glass character ($m^2$/kg salt); and percent weight gain for a series of 5 runs using the same IOX tank.

TABLE 10

| Example | Glass $m^2$/kg salt | Δm/m (%) | $CS_{max}$ (MPa) | $DOL_{sp}$ (μm) | $CS_k$ (MPa) |
|---|---|---|---|---|---|
| 13 Run #1 | 0.012 | 0.3776 | 819 | 8.30 | 77 |
| 14 Run #2 | 0.025 | 0.3760 | 806 | 8.30 | 70 |
| 15 Run #3 | 0.037 | 0.3737 | 798 | 8.30 | 62 |

TABLE 10-continued

| Example | Glass $m^2$/kg salt | Δm/m (%) | $CS_{max}$ (MPa) | $DOL_{sp}$ (μm) | $CS_k$ (MPa) |
|---|---|---|---|---|---|
| 16 Run #4 | 0.050 | 0.3692 | 803 | 8.30 | 121 |
| 17 Run #5 | 0.062 | 0.3891 | 795 | 8.50 | 64 |

After Run #4, $LiNO_3$ was estimated at 0.099 wt %. Addition of 12.8 grams of TSP was added to regenerate the tank. Li poisoning rate was ~67% that of DIOX Step 1 of Comparative Example E (380° C., 38% $NaNO_3$, 80 minutes) for a Composition A glass.

Examples 18-22

Glass articles were formed from Composition A having a thickness of 0.5 mm that were exposed to a single ion exchange (SIOX) with two alkali metals in the presence of silicic acid and two different salts to deliver one of the alkali metals according to the following conditions: bath of 9% $NaNO_3$, 86% $KNO_3$, and 5% $K_2CO_3$; 0.5 wt. % silicic acid added to the bath; 380° C.; 65 minutes. Table 11 provides $CS_{max}$ and $DOL_{sp}$ as measured by FSM (averaged over 4 samples); glass character ($m^2$/kg salt); and percent weight gain for a series of 5 runs using the same IOX tank.

TABLE 11

| Example | Glass $m^2$/kg salt | Δm/m (%) | $CS_{max}$ (MPa) | $DOL_{sp}$ (μm) |
|---|---|---|---|---|
| 18 Run #1 | 0.012 | 0.3551 | 907 | 8.30 |
| 19 Run #2 | 0.025 | 0.3571 | 906 | 8.40 |
| 20 Run #3 | 0.037 | 0.3620 | 911 | 8.50 |
| 21 Run #4 | 0.050 | 0.3487 | 904 | 8.40 |
| 22 Run #5 | 0.062 | 0.3520 | 905 | 8.50 |

Relative to Example 2, an increase of ~90 MPa $CS_{max}$ was achieved by the use of $K_2CO_3$ in conjunction with $KNO_3$. After Run #5, regeneration by TSP was not needed.

Example 23-49

Glass articles were formed from Composition A having a thickness of 0.5 mm or 0.7 mm that were exposed to a single ion exchange (SIOX) with two alkali metals. Most of the examples included two different salts to deliver one of the alkali metals. IOX Conditions are described in Table 12 below. An amount of 0.5 wt. % silicic acid was added to each bath based on the total molten bath weight.

TABLE 12

| Example | Glass | Thickness (mm) | m²/kg salt | KNO₃ (wt %) | NaNO₃ (wt %) | LiNO₃ (wt %) | K₂CO₃ (wt %) | Temp (° C.) | Time (min) |
|---|---|---|---|---|---|---|---|---|---|
| 23 Fresh | 0% K₂CO₃ | 0.5 | 0 | 91 | 9 | 0 | 0 | 380 | 65 |
| 24 Run #1 | SIOX- 9% Na | | 0 | 86.00 | 9.00 | 0.00 | 5.00 | 380 | 65 |
| 25 Run #2 | 5% K₂CO₃ | | 0.327 | 85.78 | 8.82 | 0.49 | 4.90 | 380 | 65 |
| 26 Run #3 | | | 0.711 | 85.58 | 8.65 | 0.96 | 4.81 | 380 | 65 |
| 27 Run #4 | | | 1.221 | 85.38 | 8.49 | 1.42 | 4.72 | 380 | 65 |
| 28 Run #5 | | | 1.973 | 85.19 | 8.33 | 1.85 | 4.63 | 380 | 65 |
| 29 Run #6 | | | 3.464 | 85.00 | 8.18 | 2.27 | 4.55 | 380 | 65 |
| 30 Run #1 | SIOX- 9% Na | | 0 | 81.00 | 9.00 | 0.00 | 10.00 | 380 | 65 |
| 31 Run #2 | 10% K₂CO₃ | | 0.326 | 80.88 | 8.82 | 0.49 | 9.80 | 380 | 65 |
| 32 Run #3 | | | 0.711 | 80.77 | 8.65 | 0.96 | 9.62 | 380 | 65 |
| 33 Run #4 | | | 1.221 | 80.66 | 8.49 | 1.42 | 9.43 | 380 | 65 |
| 34 Run #5 | | | 1.974 | 80.56 | 8.33 | 1.85 | 9.26 | 380 | 65 |
| 35 Run #6 | | | 3.464 | 80.45 | 8.18 | 2.27 | 9.09 | 380 | 65 |
| 36 Fresh | 0% K₂CO₃ | 0.7 | 0 | 91 | 9 | 0 | 0 | 380 | 70 |
| 37 Run #1 | SIOX- 9% Na | | 0 | 86.00 | 9.00 | 0.00 | 5.00 | 380 | 70 |
| 38 Run #2 | 5% K₂CO₃ | | 0.327 | 85.78 | 8.82 | 0.49 | 4.90 | 380 | 70 |
| 39 Run #3 | | | 0.711 | 85.58 | 8.65 | 0.96 | 4.81 | 380 | 70 |
| 40 Run #4 | | | 1.221 | 85.38 | 8.49 | 1.42 | 4.72 | 380 | 70 |
| 41 Run #5 | | | 1.974 | 85.19 | 8.33 | 1.85 | 4.63 | 380 | 70 |
| 42 Run #6 | | | 3.464 | 85.00 | 8.18 | 2.27 | 4.55 | 380 | 70 |
| 43 Run #1 | SIOX- 9% Na | | 0 | 81.00 | 9.00 | 0.00 | 10.00 | 380 | 70 |
| 44 Run #2 | 10% K₂CO₃ | | 0.327 | 80.88 | 8.82 | 0.49 | 9.80 | 380 | 70 |
| 45 Run #3 | | | 0.711 | 80.77 | 8.65 | 0.96 | 9.62 | 380 | 70 |
| 46 Run #4 | | | 1.221 | 80.66 | 8.49 | 1.42 | 9.43 | 380 | 70 |
| 47 Run #5 | | | 1.974 | 80.56 | 8.33 | 1.85 | 9.26 | 380 | 70 |
| 48 Run #6 | | | 3.464 | 80.45 | 8.18 | 2.27 | 9.09 | 380 | 70 |
| 49 Fresh | 0% K₂CO₃ | | 0 | 91 | 9 | 0 | 0 | 380 | 70 |

Examples 23-49 were analyzed as follows. Percent weight gain was calculated based on the substrate before SIOX and after SIOX. Peak compressive stress ($CS_{max}$) and depth of layer of a spike ($DOL_{sp}$) were measured by FSM. Depth of compression (DOC) and compressive stress at a knee ($CS_k$) were analyzed by RNF. Peak tension (PT) was measured by SCALP.

TABLE 13

| Example | Δm/m (%) | $CS_k$ (MPa) | $CS_{max}$ (MPa) | PT (MPa) | $DOL_{sp}$ (μm) | DOC (μm) |
|---|---|---|---|---|---|---|
| 23 Fresh | 0.3776 | 77.0 | 819.0 | −49.6 | 8.3 | 83.5 |
| 24 Run #1 | 0.3533 | 60.7 | 912.4 | −48.4 | 8.5 | — |
| 25 Run #2 | 0.3532 | 57.3 | 856.6 | −47.8 | 8.7 | — |
| 26 Run #3 | 0.3669% | 71.8 | 855.0 | −51.0 | 8.8 | — |
| 27 Run #4 | 0.3526% | 65.3 | 840.4 | −47.2 | 8.7 | — |
| 28 Run #5 | 0.3591% | 75.6 | 822.0 | −51.0 | 8.6 | — |
| 29 Run #6 | 0.3584% | 72.9 | 809.0 | −50.5 | 8.6 | — |
| 30 Run #1 | 0.3130% | 44.9 | 982.0 | −44.0 | 8.5 | — |

TABLE 13-continued

| Example | Δm/m (%) | $CS_k$ (MPa) | $CS_{max}$ (MPa) | PT (MPa) | $DOL_{sp}$ (μm) | DOC (μm) |
|---|---|---|---|---|---|---|
| 31 Run #2 | 0.3107% | 39.2 | 946.7 | −43.8 | 8.8 | — |
| 32 Run #3 | 0.3051% | 37.6 | 957.6 | −44.2 | 9.1 | — |
| 33 Run #4 | 0.3070% | 37.8 | 940.5 | −44.3 | 9.1 | — |
| 34 Run #5 | 0.3203% | 45.9 | 917.6 | −45.7 | 9.2 | — |
| 35 Run #6 | 0.3133% | 37.5 | 907.8 | −46.0 | 8.8 | — |
| 36 Fresh | 0.2957% | 83.0 | 839.0 | −42.4 | 8.7 | 110.0 |
| 37 Run #1 | 0.2659% | 77.9 | 924.0 | −41.2 | 8.9 | — |
| 38 Run #2 | 0.2518% | 85.8 | 858.6 | −39.8 | 8.7 | — |
| 39 Run #3 | 0.2604% | 81.6 | 853.2 | −42.1 | 8.8 | — |
| 40 Run #4 | 0.2502% | 87.4 | 833.4 | −41.0 | 8.8 | — |
| 41 Run #5 | 0.2650% | 86.1 | 847.9 | −42.0 | 8.9 | — |
| 42 Run #6 | 0.2602% | 84.0 | 832.2 | −41.9 | 8.7 | — |
| 43 Run #1 | 0.2437% | 86.1 | 965.5 | −40.0 | 9.3 | — |
| 44 Run #2 | 0.2333% | 51.7 | 919.5 | −39.8 | 9.0 | — |
| 45 Run #3 | 0.2397% | 52.7 | 953.9 | −38.1 | 9.2 | — |
| 46 Run #4 | 0.2366% | 54.4 | 951.7 | −41.0 | 9.2 | — |
| 47 Run #5 | 0.2320% | 54.1 | 946.1 | −38.1 | 9.3 | — |
| 48 Run #6 | 0.2434% | 53.6 | 926.4 | −38.3 | 9.3 | — |
| 49 Fresh | 0.2444% | 74.0 | 902.0 | −37.3 | 8.1 | 108.0 |

For examples using 5% $K_2CO_3$/9% $NaNO_3$, a sustainable similar PT as a fresh 91% K/9% Na tank was achieved but with a much higher $CS_{max}$.

For examples using 10% $K_2CO_3$/9% $NaNO_3$, a sustainable higher PT than the fresh 94% K/6% Na tank was achieved and with a much higher $CS_{max}$.

Example 50 and 51

Glass articles were formed from Composition A having a thickness of 0.5 mm (Example 50) and 0.7 mm (Example 51) that were exposed to a single ion exchange (SIOX). The ion exchange bath included 9 wt. % $NaNO_3$, 86 wt. % $KNO_3$, and 5 wt. % $K_2CO_3$, with 0.5 wt. % silicic acid added to the bath. The bath was at a temperature of 380° C. DOC and $CS_k$ were measured using RNF.

TABLE 14

| Example | Δm/m % | $CS_k$ MPa | $CS_{max}$ MPa | PT MPa | $DOL_{sp}$ μm | DOC μm |
|---|---|---|---|---|---|---|
| 50 | 0.3395 | 53 | 914 | 46.6 | 8.3 | 80 |
| 51 | 0.2540 | 81 | 927 | 37.9 | 8.2 | 108 |

Figure 5:
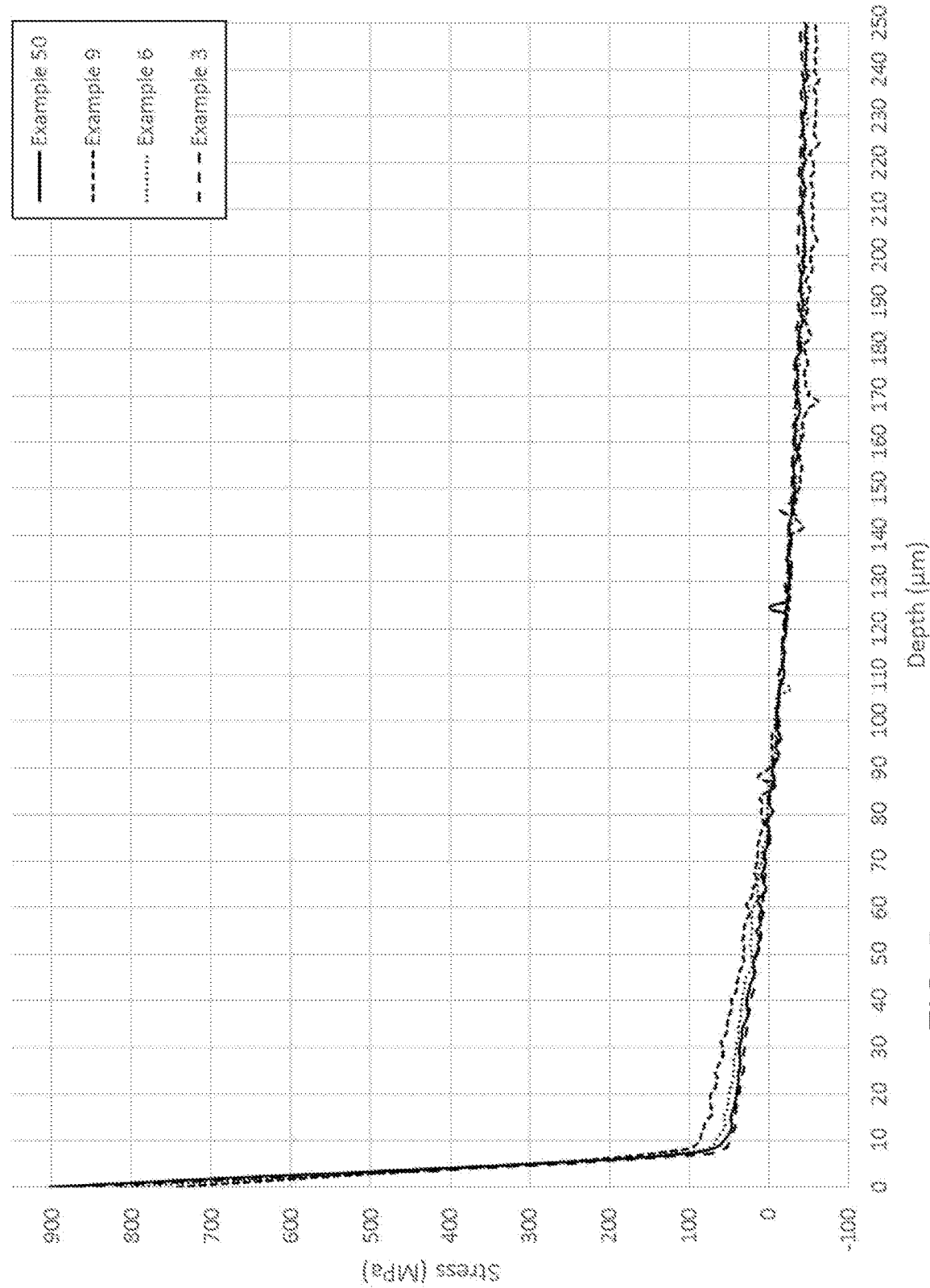
FIG. 5 is a graph of measured stress profiles for Examples 3, 6, 9, and 50.
Figure 6:
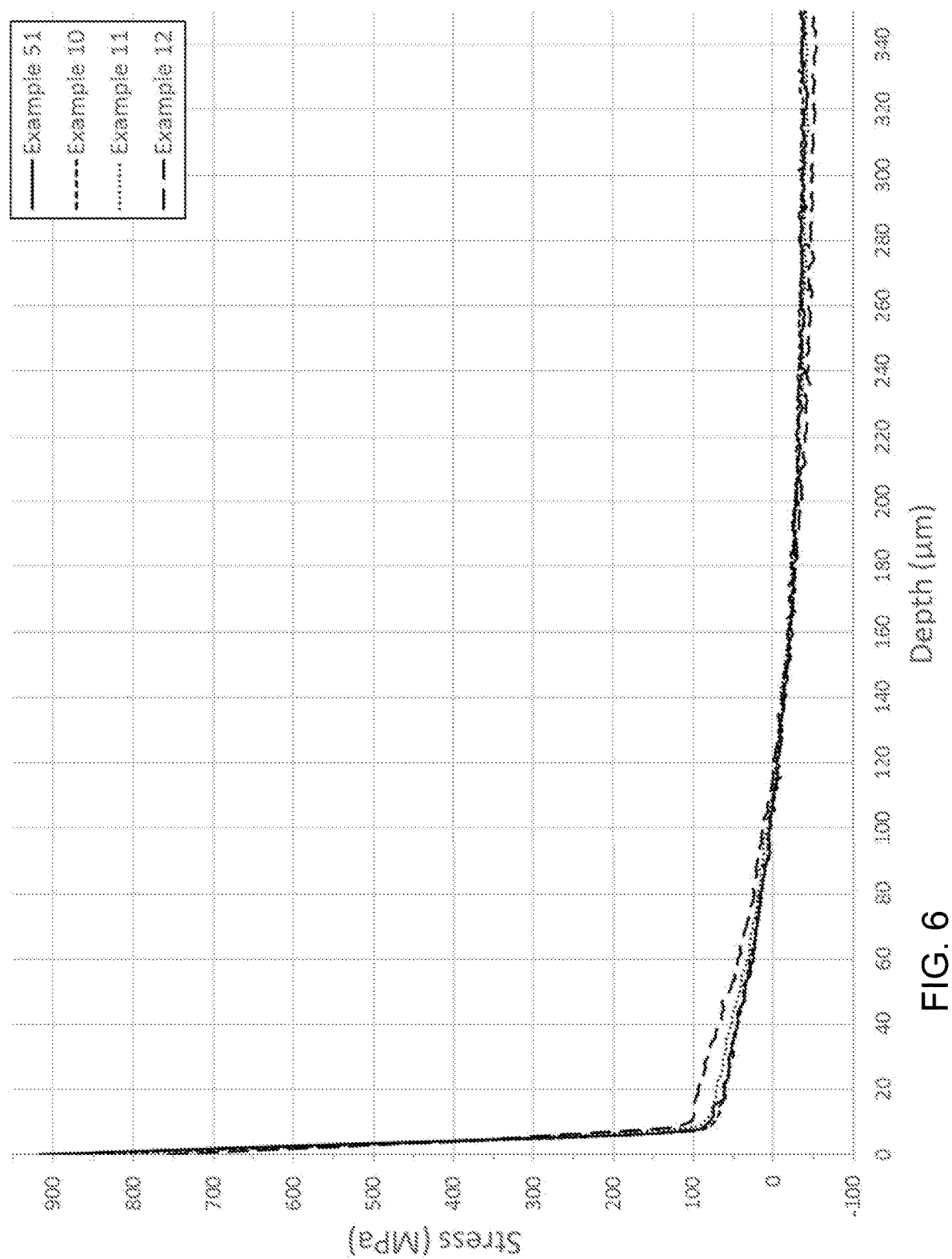
FIG. 6 is a graph of measured stress profiles for Examples 10, 11, 12, and 51.

The measured stress profiles for Examples 3, 6, 9, and 50 are shown in FIG. 5. The measured stress profiles for Examples 10, 11, 12, and 51 are shown in FIG. 6.

All compositional components, relationships, and ratios described in this specification are provided in mol % unless otherwise stated. All ranges disclosed in this specification include any and all ranges and subranges encompassed by the broadly disclosed ranges whether or not explicitly stated before or after a range is disclosed.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. A glass-based article comprising:
   a glass-based substrate comprising opposing first and second surfaces defining a substrate thickness (t); and
   a stress profile comprising:
   a peak compressive stress (CS) greater than or equal to 700 MPa;
   a peak tension (PT) less than or equal to 61 MPa;
   a compressive stress at a knee ($CS_k$) in a range of greater than or equal to 25 MPa and less than or equal to 120 MPa;
   a depth of compression (DOC) that is greater than or equal to 0.1 t;
   a spike region extending from the first surface to a depth of layer of a spike region ($DOL_{sp}$), where $DOL_{sp}$ is greater than or equal to 4.5 micrometers; and
   a stress slope of the spike region that is greater than or equal to 40 MPa/micrometer;
   wherein a ratio of DOC/$DOL_{sp}$ is greater than or equal to 12 and less than or equal to 23.

2. The glass-based article of claim 1, wherein t is greater than or equal to 0.35 mm and less than or equal to 1 mm.

3. The glass-based article of claim 1, wherein the $CS_k$ is greater than or equal to 40 MPa.

4. The glass-based article of claim 1, wherein the DOC is less than or equal to 0.18 t.

5. The glass-based article of claim 1, wherein the $DOL_{sp}$ is less than or equal to 24 micrometers.

6. The glass-based article of claim 1, comprising a merit index (MI) defined by $CS*DOL_{sp}*CS_k*DOC/PT^{0.5}$, wherein the MI is in the range of greater than or equal to $3\times10^6$ to less than or equal to $30\times10^6$ $MPa^2\mu m^2/MPa^{0.5}$.

7. The glass-based article of claim 1, comprising a damage resistant force (DRF) ratio defined by $CS*DOL_{sp}/CS_k*DOC$, wherein the DRF is in the range of greater than or equal to 0.1 to less than or equal to 5.

8. The glass-based article of claim 1, wherein the stress profile does not contain a region of negative second derivative of CS(t) at a depth of greater than or equal to $DOL_{sp}$ and less than or equal to DOC.

9. The glass-based article of claim 1, wherein the $DOL_{sp}$ is less than or equal to 10 micrometers.

10. A consumer electronic product comprising:
   a housing comprising a front surface, a back surface, and side surfaces;
   electrical components provided at least partially within the housing, the electrical components comprising at least a controller, a memory, and a display, the display being provided at or adjacent the front surface of the housing; and
   a cover disposed over the display;
   wherein a portion of at least one of the housing and the cover comprises the glass-based article of claim 1.

11. A glass-based article comprising:
a glass-based substrate comprising opposing first and second surfaces defining a substrate thickness (t);
a central composition at the center of the glass-based article comprising lithium;
a potassium (K) concentration profile that is substantially linear from a maximum K concentration to a point where the K concentration is less than or equal to 50% of the maximum K concentration; and
a stress profile comprising:
a peak compressive stress (CS), a peak tension (PT), a compressive stress at a knee ($CS_k$) in a range of greater than or equal to 25 MPa and less than or equal to 120 MPa; a depth of compression (DOC); and
a spike region extending from the first surface to a depth of layer of a spike region ($DOL_{sp}$), where $DOL_{sp}$ is greater than or equal to 0.005 t;
wherein a ratio of $DOC/DOL_{sp}$ is greater than or equal to 12 and less than or equal to 23.

12. The glass-based article of claim 11, wherein the $DOL_{sp}$ is less than or equal to 0.013 t.

13. A consumer electronic product comprising:
a housing comprising a front surface, a back surface, and side surfaces;
electrical components provided at least partially within the housing, the electrical components comprising at least a controller, a memory, and a display, the display being provided at or adjacent the front surface of the housing; and
a cover disposed over the display;
wherein a portion of at least one of the housing and the cover comprises the glass-based article of claim 11.

14. A glass-based article, comprising:
first and second surfaces defining a thickness (t), wherein the thickness is greater than or equal to 0.1 mm to less than or equal to 2 mm; and
a stress profile comprising:
a peak compressive stress (CS) greater than or equal to 800 MPa;
a peak tension (PT) less than or equal to 61 MPa;
a compressive stress at a knee ($CS_k$) greater than or equal to 25 MPa and less than or equal to 120 MPa;
a depth of compression (DOC) that is greater than or equal to 0.1 t;
a spike region extending from the first surface to a depth of layer of a spike region ($DOL_{sp}$), where $DOL_{sp}$ is greater than or equal to 7 μm;
wherein a ratio of $DOC/DOL_{sp}$ is greater than or equal to 12 and less than or equal to 23.

15. The glass-based article of claim 14, wherein the CS is less than or equal to 1000 MPa.

16. The glass-based article of claim 14, wherein the PT is greater than or equal to 30 MPa.

17. The glass-based article of claim 14, wherein the DOC is less than or equal to 0.18 t.

18. The glass-based article of claim 14, wherein the $DOL_{sp}$ is less than or equal to 10 μm.

19. The glass-based article of claim 14, wherein a value of $CS_k/t$ is greater than or equal to 40 MPa/mm.

20. The glass-based article of claim 14, wherein the glass-based article comprises lithium.

21. The glass-based article of claim 14, wherein a stress slope of the spike region is greater than or equal to 40 MPa/μm.

22. A consumer electronic product comprising:
a housing comprising a front surface, a back surface, and side surfaces;
electrical components provided at least partially within the housing, the electrical components comprising at least a controller, a memory, and a display, the display being provided at or adjacent the front surface of the housing; and
a cover disposed over the display;
wherein a portion of at least one of the housing and the cover comprises the glass-based article of claim 14.

* * * * *